(12) United States Patent
Nozawa

(10) Patent No.: US 7,989,122 B2
(45) Date of Patent: Aug. 2, 2011

(54) PHOTOMASK BLANK, PHOTOMASK, AND METHODS OF MANUFACTURING THE SAME

(75) Inventor: Osamu Nozawa, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 185 days.

(21) Appl. No.: 12/414,198

(22) Filed: Mar. 30, 2009

(65) Prior Publication Data

US 2009/0246645 A1 Oct. 1, 2009

(30) Foreign Application Priority Data

Mar. 31, 2008 (JP) ................................. 2008-094139

(51) Int. Cl.
*G03F 1/00* (2006.01)
*G03F 7/00* (2006.01)
(52) U.S. Cl. .......................................... 430/5; 430/322
(58) Field of Classification Search .............. 430/5, 322; 428/428, 430
See application file for complete search history.

(56) References Cited

U.S. PATENT DOCUMENTS

2007/0212618 A1* 9/2007 Yoshikawa et al. ............... 430/5

FOREIGN PATENT DOCUMENTS

| JP | 2003-322947 A | 11/2003 |
| JP | 2005-345737 A | 12/2005 |
| JP | 2007-241065 A | 9/2007 |
| JP | 2007-241136 A | 9/2007 |

* cited by examiner

*Primary Examiner* — Stephen Rosasco
(74) *Attorney, Agent, or Firm* — Sughrue Mion, PLLC

(57) ABSTRACT

A photomask blank is for manufacturing a phase shift mask having a light-transmitting substrate provided with a phase shift portion adapted to give a predetermined phase difference to transmitted exposure light. The phase shift portion is a dug-down part that is dug down from a surface of the light-transmitting substrate to a digging depth adapted to produce the predetermined phase difference with respect to exposure light transmitted through the light-transmitting substrate at a portion where the phase shift portion is not provided. The photomask blank includes, on the digging-side surface of the light-transmitting substrate, an etching mask film that is made of a material being dry-etchable with a chlorine-based gas, but not dry-etchable with a fluorine-based gas, and serves as an etching mask at least until, when forming the dug-down part by dry etching, the dry etching reaches the digging depth. The photomask blank further includes, on a surface of the etching mask film, a light-shielding film that is made of a material mainly containing tantalum and has a thickness so as to be removable during the dry etching for forming the dug-down part of the light-transmitting substrate.

14 Claims, 8 Drawing Sheets

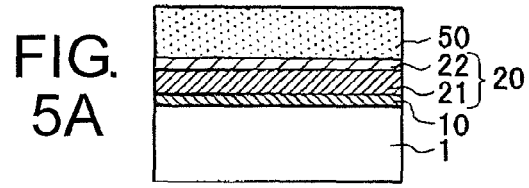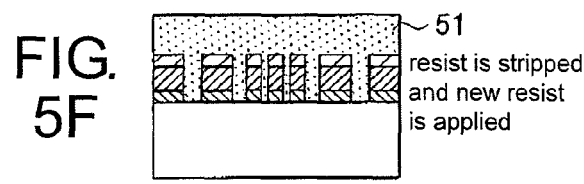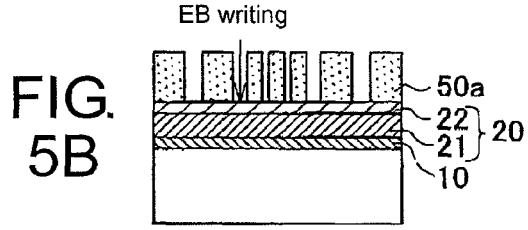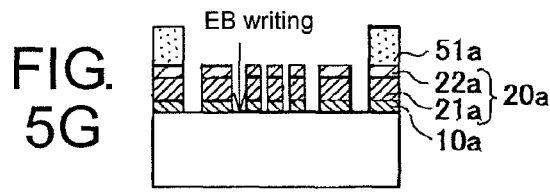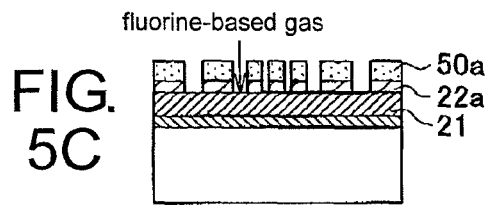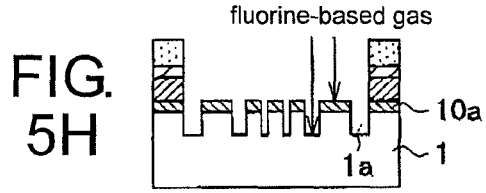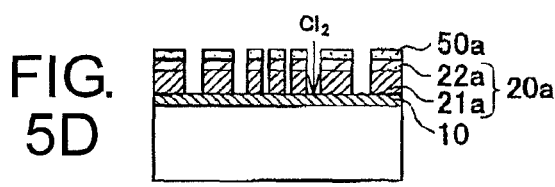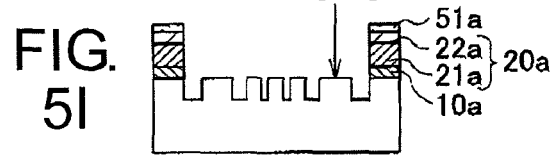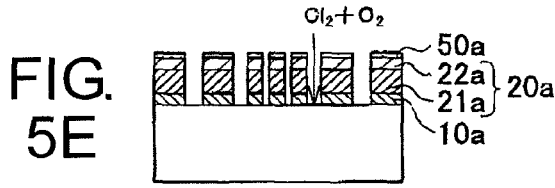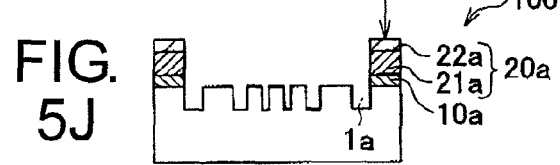

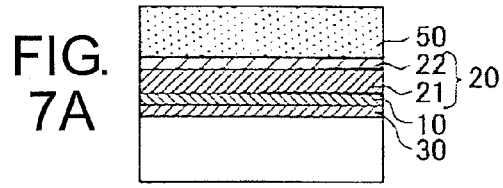
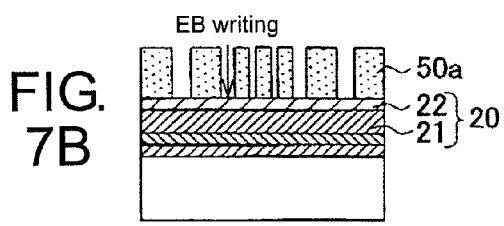
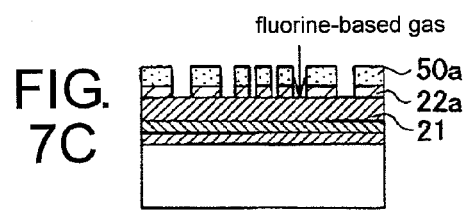
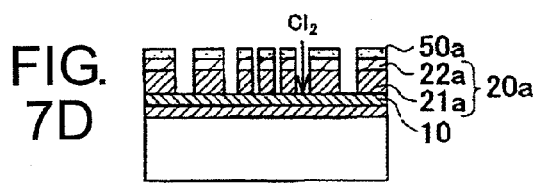
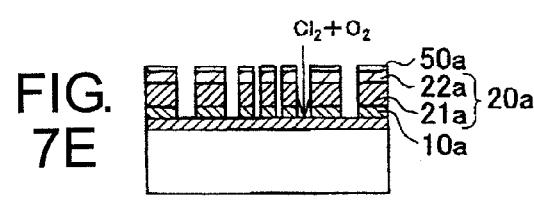
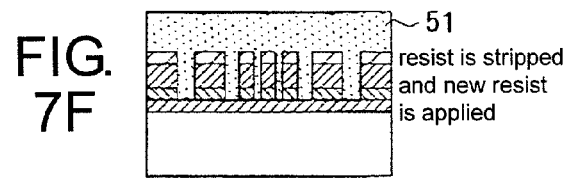
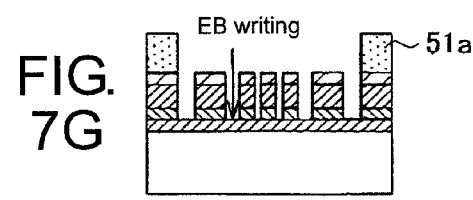
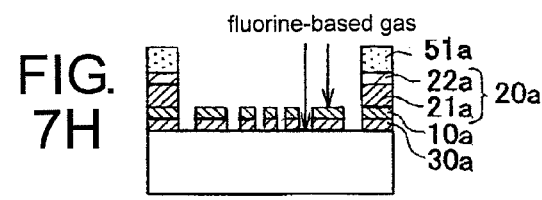
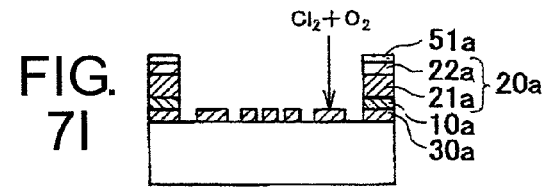
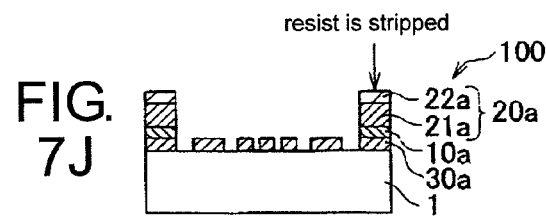

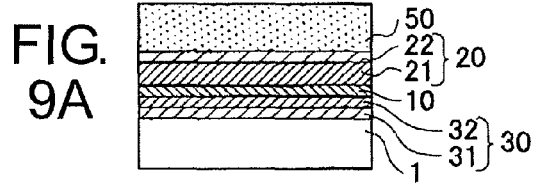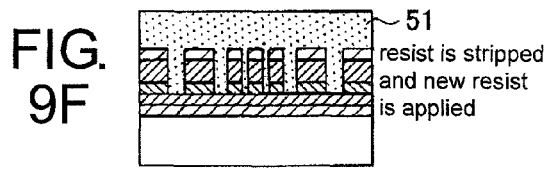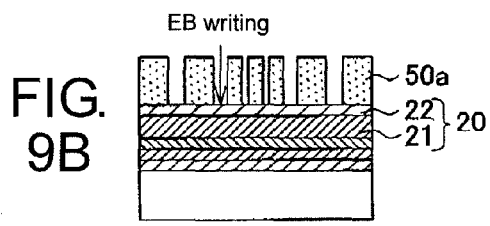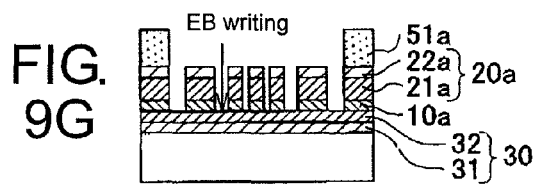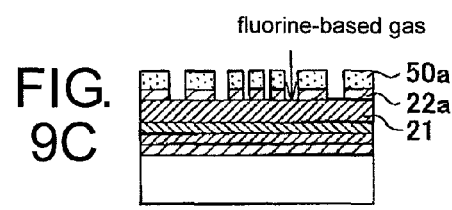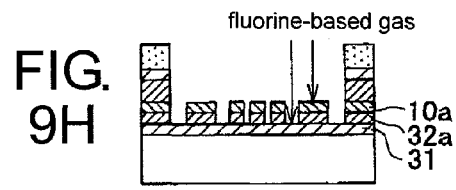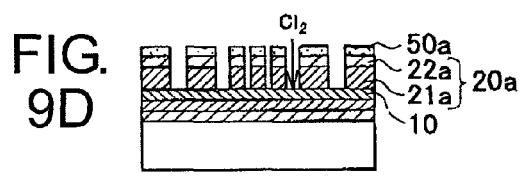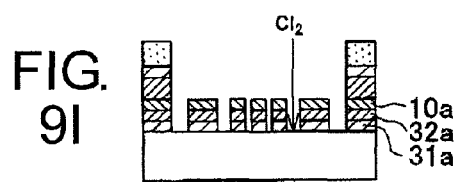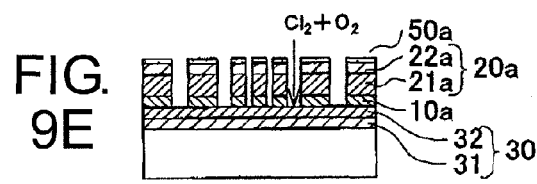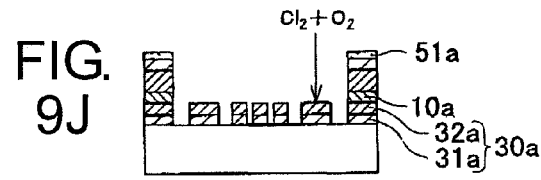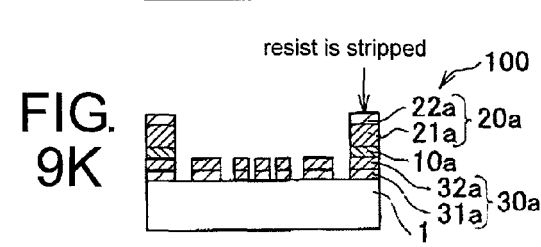

PHOTOMASK BLANK, PHOTOMASK, AND METHODS OF MANUFACTURING THE SAME

This application is based upon and claims the benefit of priority from Japanese Patent Application No. 2008-94139, filed on Mar. 31, 2008, the disclosure of which is incorporated herein in its entirety by reference.

TECHNICAL FIELD

This invention relates to a photomask blank and a photomask for use in manufacturing semiconductor devices and so on and to methods of manufacturing the same.

BACKGROUND ART

Miniaturization of semiconductor devices and so on has the advantage of achieving improvement in performance and function (high-speed operation, low power consumption, etc.) and reduction in cost and is increasingly accelerated. Such miniaturization is supported by the lithography technology. A transfer mask is one of key techniques, as well as an exposure apparatus and a resist material.

In recent years, development is made of the technology for a 45 nm to 32 nm half-pitch (hp) generation defined in the semiconductor design rule. The half pitch of 45 nm to 32 nm corresponds to ¼ to ⅙ of the wavelength of 193 nm of ArF excimer laser exposure light (hereinafter referred to as "ArF exposure light"). In particular, in the 45 nm hp generation and beyond, only the application of the resolution enhancement technology (RET) such as conventional phase shift technique, oblique-incidence illumination, and pupil filtering, and the optical proximity correction (OPC) has become insufficient. Therefore, the hyper-NA technique (immersion lithography) and the double exposure (double patterning) technique are required.

In the meantime, circuit patterns necessary in the semiconductor manufacture are exposed in sequence onto a semiconductor wafer by a plurality of photomask (reticle) patterns. For example, a reduced projection exposure apparatus with a predetermined reticle set therein repeatedly projects and exposes patterns while sequentially shifting projection regions on a semiconductor wafer (step-and-repeat system), or repeatedly projects and exposes patterns while synchronously scanning the reticle and a semiconductor wafer with respect to a projection optical system (step-and-scan system). By this, a predetermined number of integrated circuit chip regions are formed in the semiconductor wafer.

A photomask (reticle) has a region formed with a transfer pattern and a peripheral region thereof, i.e. an edge region along four sides in the photomask (reticle). When exposing the transfer pattern of the photomask (reticle) while sequentially shifting projection regions on a semiconductor wafer, the transfer pattern is exposed and transferred onto the projection regions so that the photomask peripheral regions overlap each other for the purpose of increasing the number of integrated circuit chips to be formed. In order to prevent exposure of a resist on the wafer due to such overlapping exposure, a light-shielding band (light-shielder band or light-shielder ring) is formed in the peripheral region of the photomask by mask processing.

The phase shift method is a technique of giving a predetermined phase difference to exposure light transmitted through a phase shift portion, thereby improving the resolution of a transfer pattern using interference of light.

As photomasks improved in resolution by the phase shift method, there are a substrate dug-down type in which a shifter portion is provided by digging down a quartz substrate by etching or the like, and a type in which a shifter portion is provided by patterning a phase shift film formed on a substrate.

SUMMARY OF THE INVENTION

As photomasks of the substrate dug-down (carved) type, there are a Levenson-type phase shift mask, an enhancer-type phase shift mask, a chromeless phase shift mask, and so on. As chromeless phase shift masks, there are a type in which a light-shielding layer on lines is completely removed, and a type in which a light-shielding layer on lines is patterned (so-called zebra type). A Levenson-type phase shift mask or a chromeless phase shift mask of the type in which a light-shielding layer in a transfer region is completely removed is also called an alternative phase shifter which is a phase shift mask of the type in which exposure light incident on a phase shift portion is transmitted at approximately 100%. An enhancer-type phase shift mask is provided with a light-shielding portion, a transmittance control portion (phase shift of 360°=0°), and a 180° shift portion formed by digging down a glass. In any type, it is necessary to form a light-shielding band in an edge region (peripheral region) along four sides in the photomask (reticle).

As a photomask blank for manufacturing such a chromeless phase shift mask, there is known one in which a CrO/Cr light-shielding film comprising a light-shielding layer made of Cr and a low reflection layer made of CrO stacked together is formed on a transparent substrate and has a total thickness of 70 to 100 nm (see, e.g. JP-A-2007-241136 (Patent Document 1), paragraph [0005]). In manufacturing processes of the chromeless phase shift mask, the substrate is dug down using a light-shielding film pattern as an etching mask and, after removing a resist pattern used for forming the light-shielding film pattern, a resist is applied again and subjected to exposure and development so as to protect a portion where the light-shielding film is to remain, and then the light-shielding film at an unnecessary portion is removed by etching, thereby obtaining the photomask having a light-shielding band in the substrate peripheral region and a light-shielding pattern in the transfer region according to need. That is, the light-shielding film has both a function as an etching mask (also called a hard mask) and a function as a layer for forming the light-shielding band and the light-shielding pattern (function of ensuring the light-shielding performance).

Generally, in order to improve the CD performance of a photomask, it is effective to reduce the thickness of a light-shielding film and the thickness of a resist for forming the light-shielding film. However, if the thickness of the light-shielding film is reduced, the CD value (optical density) decreases. In the case of the above CrO/Cr light-shielding film, the total thickness of about 60 nm is required at minimum for achieving OD=3 which is generally required, and thus, it is difficult to largely reduce the thickness thereof. If the thickness of the light-shielding film cannot be reduced, it is also not possible to reduce the thickness of the resist due to the etching selectivity between the light-shielding film and the resist. Thus, a large improvement in CD cannot be expected.

As a measure for this, Patent Document 1 proposes a method. This method is intended to satisfy the above requirement by forming a light-shielding film and an etching mask film of different materials.

In the method of Patent Document 1, the layer structure is, for example, substrate/Cr-based second etching mask film/ MoSi-based light-shielding film/Cr-based first etching mask film (also serving as an antireflection film) and thus a Cr-based material is used as the first etching mask film at the outermost surface farthest from the substrate (see Patent Document 1, paragraph [0038] etc.). By this, a resist film to be applied on the upper surface of the first etching mask film is only required, at minimum, to transfer a pattern to the first etching mask film and thus a reduction in thickness of the resist film can be achieved to some degree. However, the first etching mask film of the Cr-based material should be dry-etched with a mixed gas of chlorine and oxygen and thus the etching selectivity to the resist is low (etching amount of the resist is large). Therefore, there is a problem that it is difficult to largely reduce the thickness of the resist film (to realize a resist film thickness of 200 nm or less and further 150 nm) and the CD accuracy cannot be set to be sufficient, and therefore, it is difficult to realize high accuracy with a mask pattern resolution of about 65 nm or less and further 50 nm or less.

Further, in the method of Patent Document 1, the layer structure is such that the two Cr-based etching mask films are provided above and below the MoSi-based light-shielding film, and therefore, there is a problem that the processes of manufacturing the photomask blank become complicated.

Further, there is also a problem that the manufacturing processes become complicated because the number of layers is large. For example, in this method, it is necessary to use the photomask blank having the layer structure of substrate/Cr-based second etching mask film/MoSi-based light-shielding film/Cr-based first etching mask film (also serving as an anti-reflection film) (see Patent Document 1, paragraph [0038] etc.), and therefore, there is a problem that the manufacturing processes become complicated due to a large number of layers.

The above description also applies to the case of using a photomask blank having a layer structure of, for example, Substrate/MoSi-based phase shift film/Cr-based second etching mask film/MoSi-based light-shielding film/Cr-based first etching mask film (also serving as an antireflection film) (see JP-A-2007-241065 (Patent Document 2), paragraph [0174] etc.) and thus there is a problem that the manufacturing processes become complicated due to a large number of layers.

Further, the light-shielding film made of a MoSi-based material has low resistance to chemical cleaning (particularly to ammonia-hydrogen peroxide mixture cleaning) and also has low resistance to hot water cleaning (e.g. cleaning with hot water of 90° C.) and, therefore, there is a problem in cleaning after manufacturing a photomask.

It is an object of this invention to provide photomask blank and photomask manufacturing methods that can simplify manufacturing processes without sacrificing processing accuracy.

It is an object of this invention to provide photomask blank and photomask manufacturing methods that can reduce the number of layers without sacrificing processing accuracy.

It is an object of this invention to provide methods of manufacturing a photomask blank and a photomask that can achieve, with a small number of layers, the following four subjects (1) to (4) that are closely related to each other:

(1) To realize a resolution of about 65 nm or less and further 50 nm or less with respect to a pattern on a photomask;

(2) To ensure an optical density OD>3 of a light-shielding portion comprising a light-shielding film or a light-shielding film and upper and lower layers thereof;

(3) To prevent collapse of a resist pattern by realizing a ratio of the height (thickness) of the resist pattern to the width thereof being three or less (realizing a resist film thickness of 200 nm or less and further 150 nm) due to a reduction in resist film thickness;

(4) To ensure the conductivity of a film coated with an EB resist; and (5) To improve the resistance of a photomask, manufactured from a photomask blank, to chemical cleaning and hot water cleaning.

The present inventor has found that the above objects can be achieved not by using a Cr-based thin film as an etching mask film to be directly transferred with a resist film pattern like in the method described in Patent Document 1 wherein the layer structure is, for example, substrate/Cr-based second etching mask film/MoSi-based light-shielding film/Cr-based first etching mask film (also serving as an antireflection film), but by using a light-shielding film mainly containing Ta and directly transferring a resist film pattern onto the light-shielding film, and has completed this invention.

In this invention, for example, in a halftone or glass dug-down type phase shift mask, use is made of a photomask blank having a light-shielding film in which a thin film layer mainly containing Cr, a light-shielding layer mainly containing Ta, and an antireflection layer mainly containing Ta oxide are stacked together in this order.

The thin film layer mainly containing Cr is not substantially dry-etched with a fluorine-based gas and thus serves as an etching mask (also called a hard mask) when etching a halftone phase shift film or a glass substrate using a fluorine-based gas. The antireflection layer mainly containing Ta oxide is not substantially dry-etched with a mixed gas of a chlorine-based gas and an oxygen gas and, further, Ta is a material to be easily oxidized and thus is oxidized and not substantially dry-etched with a mixed gas of chlorine and oxygen. Therefore, the antireflection layer mainly containing Ta oxide serves as a hard mask when etching the thin film layer mainly containing Cr with a mixed gas of a chlorine-based gas and an oxygen gas. A resist film has higher etching resistance to a fluorine-based gas used in dry-etching a Ta-based light-shielding film than to a mixed gas of a chlorine-based gas and an oxygen gas. Therefore, it is possible to achieve a reduction in thickness of the resist film and further to enhance the processing accuracy when transferring a pattern onto the Ta-based light-shielding film.

The light-shielding layer mainly containing Ta and the antireflection layer mainly containing Ta oxide are removed during etching with a fluorine-based gas for forming a phase shift pattern and, thus, only the thin film layer mainly containing Cr remains after the formation of the phase shift pattern. Therefore, it is also possible to simplify the manufacturing processes for manufacturing a photomask.

The effects of this invention will be shown below.

(1) A Ta-based film is used as a hard mask in etching of a Cr-based film, which enables a reduction in resist film thickness necessary for fine pattern formation. Simultaneously, sufficient light-shielding performance (OD) is maintained.

(2) The Ta-based film is removed during etching with a fluorine-based gas for forming a phase shift pattern and the remaining Cr-based film can be removed by dry etching with a mixed gas of a chlorine-based gas and an oxygen gas or by a chemical solution such as ceric ammonium nitrate without damaging the phase shift pattern.

(3) By forming an antireflection layer as a Ta oxide layer, it is possible to improve the resistance to hot water and alkali, which otherwise becomes a problem with an antireflection film of MoSiON or the like.

This invention has the following aspects.

(First Aspect)

A photomask blank for manufacturing a phase shift mask having a light-transmitting substrate provided with a phase shift portion adapted to give a predetermined phase difference to transmitted exposure light, wherein the phase shift portion is a dug-down part that is dug down from a surface of the light-transmitting substrate to a digging depth adapted to produce the predetermined phase difference with respect to exposure light transmitted through the light-transmitting substrate at a portion where the phase shift portion is not provided, and the photomask blank comprises:

an etching mask film, on a digging-side surface of the light-transmitting substrate, that is made of a material being dry-etchable with a chlorine-based gas, but not dry-etchable with a fluorine-based gas, and serves as an etching mask at least until, when forming the dug-down part by dry etching, the dry etching reaches the digging depth; and a light-shielding film, on a surface of the etching mask film, that is made of a material mainly containing tantalum and has a thickness so as to be removable during the dry etching for forming the dug-down part of the light-transmitting substrate.

(Second Aspect)

A photomask blank for manufacturing a phase shift mask having a light-transmitting substrate provided with a phase shift portion adapted to give a predetermined phase difference to transmitted exposure light, wherein the phase shift portion is a phase shift film adapted to give a predetermined phase change amount to the transmitted exposure light, and the photomask blank comprises:

an etching mask film, on a surface of the phase shift film, that is made of a material being dry-etchable with a chlorine-based gas, but not dry-etchable with a fluorine-based gas, and serves as an etching mask at least until a transfer pattern is formed in the phase shift film by dry etching; and a light-shielding film, on a surface of the etching mask film, that is made of a material mainly containing tantalum and has a thickness so as to be removable during the dry etching for forming the transfer pattern in the phase shift film.

(Third Aspect)

A photomask blank according to first or second aspect, wherein the light-shielding film comprises:

a light-shielding layer mainly containing tantalum nitride; and an antireflection layer stacked on an upper surface of the light-shielding layer and mainly containing tantalum oxide.

(Fourth Aspect)

A photomask blank according to any one of first to third aspects, wherein the thickness of the light-shielding film is 15 nm to 50 nm.

(Fifth Aspect)

A photomask blank according to any one of first to fourth aspects, wherein the etching mask film is made of a material mainly containing one of chromium, chromium nitride, chromium oxide, chromium oxynitride, and chromium oxycarbonitride.

(Sixth Aspect)

A photomask blank according to any one of first to fifth aspects, wherein the etching mask film has a thickness of 5 nm to 40 nm.

(Seventh Aspect)

A photomask blank according to any one of second to sixth aspects, wherein the phase shift film is made of a material mainly containing one of molybdenum silicide, molybdenum silicide nitride, molybdenum silicide oxide, and molybdenum silicide oxynitride.

(Eighth Aspect)

A photomask blank according to claim any one of second to sixth aspects, wherein the phase shift film comprises a phase adjusting layer made of a material mainly containing silicon oxide or silicon oxynitride and a transmittance adjusting layer made of a material mainly containing tantalum or a tantalum-hafnium alloy.

(Ninth Aspect)

A photomask manufactured using the photomask blank according to any one of first to eighth aspects.

According to this invention, it is possible to provide photomask blank and photomask manufacturing methods that can simplify manufacturing processes without sacrificing processing accuracy.

According to this invention, it is possible to provide photomask blank and photomask manufacturing methods that can reduce the number of layers without sacrificing processing accuracy.

According to this invention, it is possible to provide methods of manufacturing a photomask blank and a photomask that can achieve, with a small number of layers, the following four subjects (1) to (4) that are closely related to each other:

(1) To realize a resolution of about 65 nm or less and further 50 nm or less with respect to a pattern on a photomask;

(2) To ensure an optical density OD>3 of a light-shielding portion comprising a light-shielding film or a light-shielding film and upper and lower layers thereof;

(3) To prevent collapse of a resist pattern by realizing a ratio of the height (thickness) of the resist pattern to the width thereof being three or less (realizing a resist film thickness of 200 nm or less and further 150 nm) due to a reduction in resist film thickness;

(4) To ensure the conductivity of a film coated with an EB resist; and (5) To improve the resistance of a photomask, manufactured from a photomask blank, to chemical cleaning and hot water cleaning.

BRIEF DESCRIPTION OF THE DRAWINGS

FIGS. 5A to 5J are exemplary sectional views for explaining manufacturing processes of a photomask according to Example 2 of this invention;

FIGS. 7A to 7J are exemplary sectional views for explaining manufacturing processes of a photomask according to Example 4 of this invention;

FIGS. 9A to 9K are exemplary sectional views for explaining manufacturing processes of a photomask according to Example 6 of this invention.

DETAILED DESCRIPTION OF THE INVENTION

Hereinbelow, this invention will be described in detail.

According to this invention of the first aspect, there is provided a photomask blank for manufacturing a phase shift mask having a light-transmitting substrate provided with a phase shift portion adapted to give a predetermined phase difference to transmitted exposure light, wherein the phase shift portion is a dug-down part that is dug down from a surface of the light-transmitting substrate to a digging depth adapted to produce the predetermined phase difference with respect to exposure light transmitted through the light-transmitting substrate at a portion where the phase shift portion is not provided, and the photomask blank comprises:

an etching mask film, on a digging-side surface of the light-transmitting substrate, that is made of a material being dry-etchable with a chlorine-based gas, but not dry-etchable with a fluorine-based gas, and serves as an etching mask at least until, when forming the dug-down part by dry etching, the dry etching reaches the digging depth; and a light-shielding film, on a surface of the etching mask film, that is made of a material mainly containing tantalum and has a thickness so as to be removable during the dry etching for forming the dug-down part of the light-transmitting substrate.

In this invention, the material not dry-etchable with the fluorine-based gas also includes a material that is physically etched, but serves as an etching mask until the dug-down part reaches the digging depth adapted to produce the predetermined phase difference while the dry etching is performed using the fluorine-based gas for forming the dug-down part on the light-transmitting substrate.

According to this aspect, the light-shielding film made of the material mainly containing tantalum and having the thickness so as to be removable during the dry etching for forming the dug-down part of the light-transmitting substrate is removed during the dry etching for forming the dug-down part of the light-transmitting substrate. Therefore, it is possible to simplify the manufacturing processes.

Further, by the use of the tantalum-based light-shielding film, it is possible to achieve a reduction in thickness of a resist to be formed thereon, which is necessary for fine pattern formation. This is because the resist is highly resistant to an etching gas for the tantalum-based light-shielding film.

Moreover, a photomask manufactured from this photomask blank can be highly resistant to chemical cleaning and hot water cleaning. This is because the tantalum-based light-shielding film is highly resistant to chemical cleaning (particularly to ammonia-hydrogen peroxide mixture cleaning) and hot water cleaning.

Figure 1:
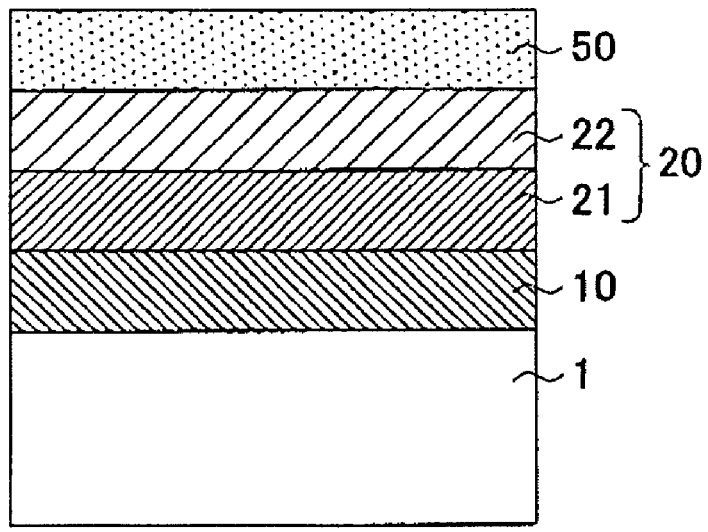
FIG. 1 is an exemplary sectional view showing one example of a photomask blank according to a first embodiment of this invention.

FIG. 1 shows one example of a photomask blank according to a first embodiment of this invention.

The photomask blank shown in FIG. 1 is used for manufacturing a phase shift mask of the substrate dug-down type.

This photomask blank comprises an etching mask film 10, a Ta-based light-shielding film 20 composed of a Ta-based light-shielding layer 21 and a Ta-based antireflection layer 22, and a resist film 50 which are formed in this order on a surface of a transparent substrate 1.

Figure 4A:
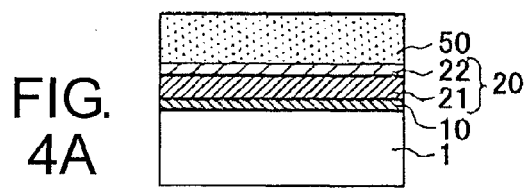
FIGS. 4A to 4I are exemplary sectional views for explaining manufacturing processes of a photomask according to Example 1 of this invention.
Figure 4B:
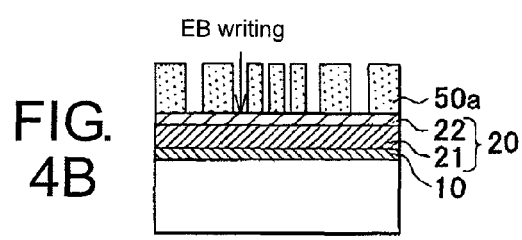
Figure 4C:
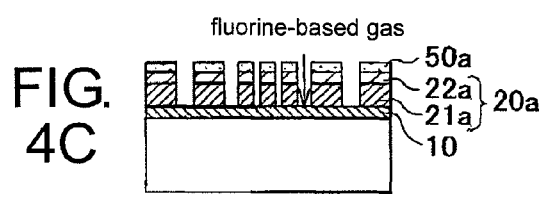
Figure 4D:
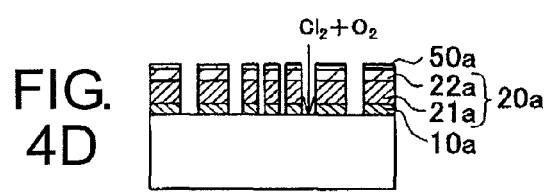
Figure 4E:
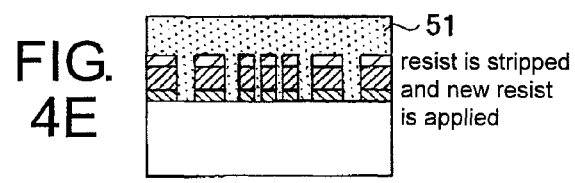
Figure 4F:
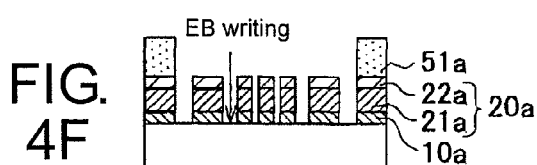
Figure 4G:
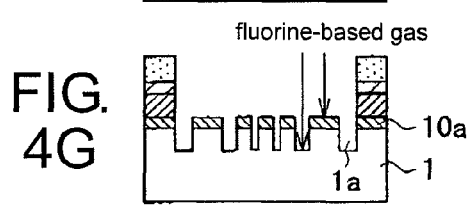
Figure 4H:
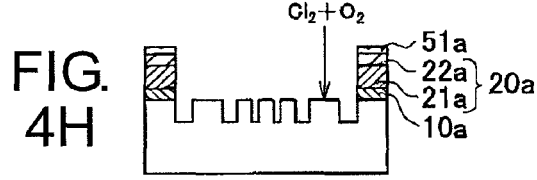
Figure 4I:
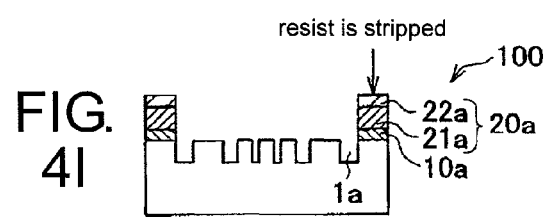

FIG. 4I shows one example of a phase shift mask of the substrate dug-down type.

According to this invention of the second aspect, there is provided a photomask blank for manufacturing a phase shift mask having a light-transmitting substrate provided with a phase shift portion adapted to give a predetermined phase difference to transmitted exposure light, wherein the phase shift portion is a phase shift film adapted to give a predetermined phase change amount to the transmitted exposure light, and the photomask blank comprises:

an etching mask film, on a surface of the phase shift film, that is made of a material being dry-etchable with a chlorine-based gas, but not dry-etchable with a fluorine-based gas, and serves as an etching mask at least until a transfer pattern is formed in the phase shift film by dry etching; and a light-shielding film, on a surface of the etching mask film, that is made of a material mainly containing tantalum and has a thickness so as to be removable during the dry etching for forming the transfer pattern in the phase shift film.

According to this aspect, the light-shielding film made of the material mainly containing tantalum and having the thickness so as to be removable during the dry etching for forming the transfer pattern in the phase shift film is removed during the dry etching for forming the transfer pattern in the phase shift film. Therefore, it is possible to simplify the manufacturing processes.

Further, by the use of the tantalum-based light-shielding film, it is possible to achieve a reduction in thickness of a resist to be formed thereon, which is necessary for fine pattern formation.

Moreover, by the use of the tantalum-based light-shielding film, a photomask manufactured from this photomask blank can be highly resistant to chemical cleaning and hot water cleaning.

Figure 2:
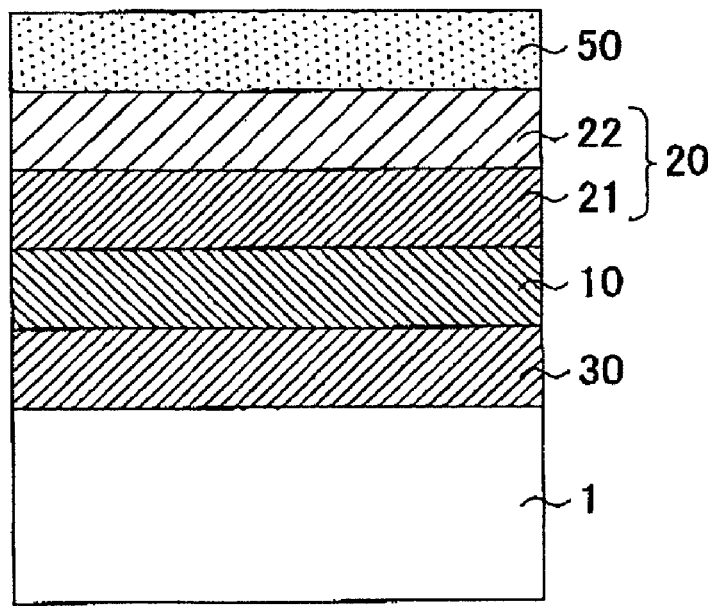
FIG. 2 is an exemplary sectional view showing one example of a photomask blank according to a second or third embodiment of this invention.

FIG. 2 shows one example of a photomask blank according to a second embodiment of this invention.

The photomask blank shown in FIG. 2 is used for manufacturing a phase shift mask of the type in which a substrate is not basically dug down and a phase shift portion is formed by a halftone phase shift film.

This photomask blank comprises a halftone phase shift film 30, an etching mask film 10, a Ta-based light-shielding film 20 composed of a Ta-based light-shielding layer 21 and a Ta-based antireflection layer 22, and a resist film 50 which are formed in this order on a surface of a transparent substrate 1.

Figure 6A:
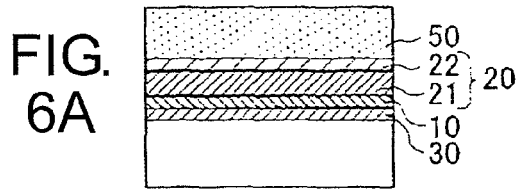
FIGS. 6A to 6I are exemplary sectional views for explaining manufacturing processes of a photomask according to Example 3 of this invention.
Figure 6B:
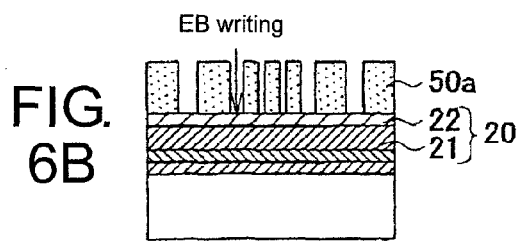
Figure 6C:
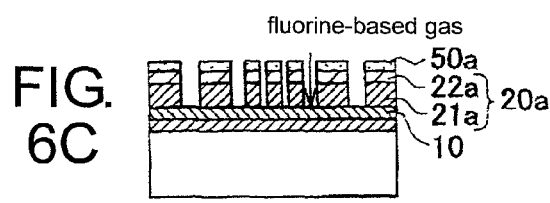
Figure 6D:
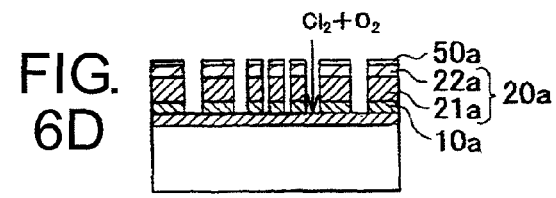
Figure 6E:
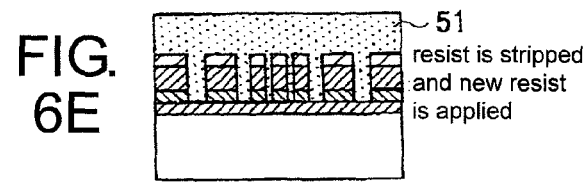
Figure 6F:
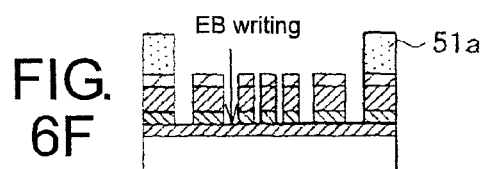
Figure 6G:
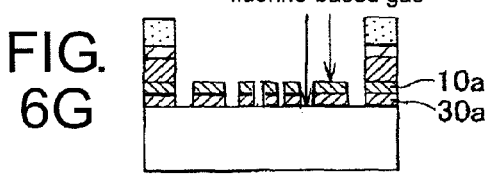
Figure 6H:
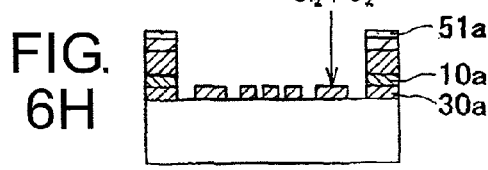
Figure 6I:
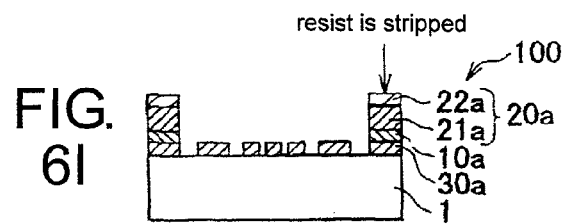

FIG. 6I shows one example of a phase shift mask of this type. As shown in FIG. 6I, this type of phase shift mask has a halftone phase shift film pattern 30a on a substrate 1.

One example of a photomask blank according to a third embodiment of this invention will be described with reference to FIG. 2 which was used for describing the second embodiment of this invention.

The photomask blank according to the third embodiment is used for manufacturing a phase shift mask of the type in which a high-transmittance phase shift portion is formed by providing a halftone phase shift film and further by digging down a substrate.

This photomask blank comprises a halftone phase shift film 30, an etching mask film 10, a Ta-based light-shielding film 20 composed of a Ta-based light-shielding layer 21 and a Ta-based antireflection layer 22, and a resist film 50 which are formed in this order on a surface of a transparent substrate 1.

Figure 8A:
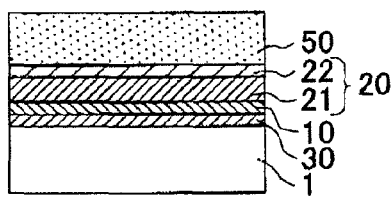
FIGS. 8A to 8J are exemplary sectional views for explaining manufacturing processes of a photomask according to Example 5 of this invention.
Figure 8B:
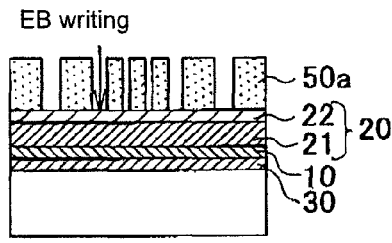
Figure 8C:
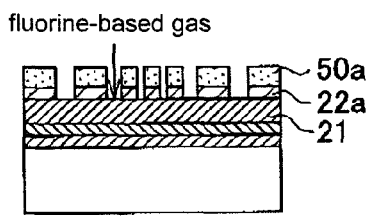
Figure 8D:
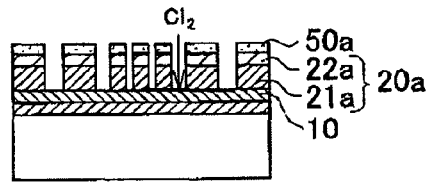
Figure 8E:
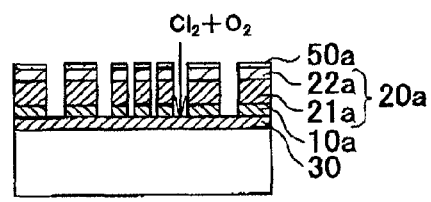
Figure 8F:
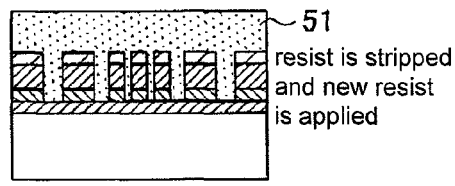
Figure 8G:
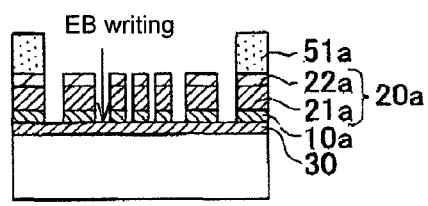
Figure 8H:
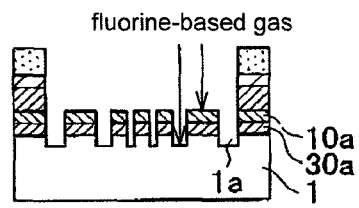
Figure 8I:
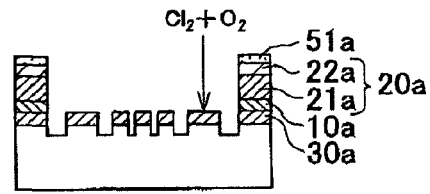
Figure 8J:
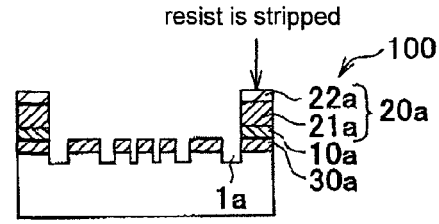

FIG. 8J shows one example of a phase shift mask of this type. As shown in FIG. 8J, this type of phase shift mask has a phase shift portion configured by forming a thin halftone phase shift film pattern 30a on a dug-down part 1a of a substrate. In the case of the single-layer phase shift film shown in the second embodiment, a considerably large thickness is required for giving a predetermined phase difference (phase shift amount) to exposure light and simultaneously controlling the transmittance to a predetermined value for the exposure light. In view of this, the photomask blank according to the third embodiment realizes high transmittance for exposure light by reducing the thickness of the single-layer phase shift film and further realizes that a predetermined phase difference is given to the exposure light by providing the dug-down part 1*a*, having a thickness corresponding to a phase shift amount lessened by reducing the film thickness, at a substrate exposed portion where the halftone phase shift film pattern 30*a* is not formed.

Figure 3:
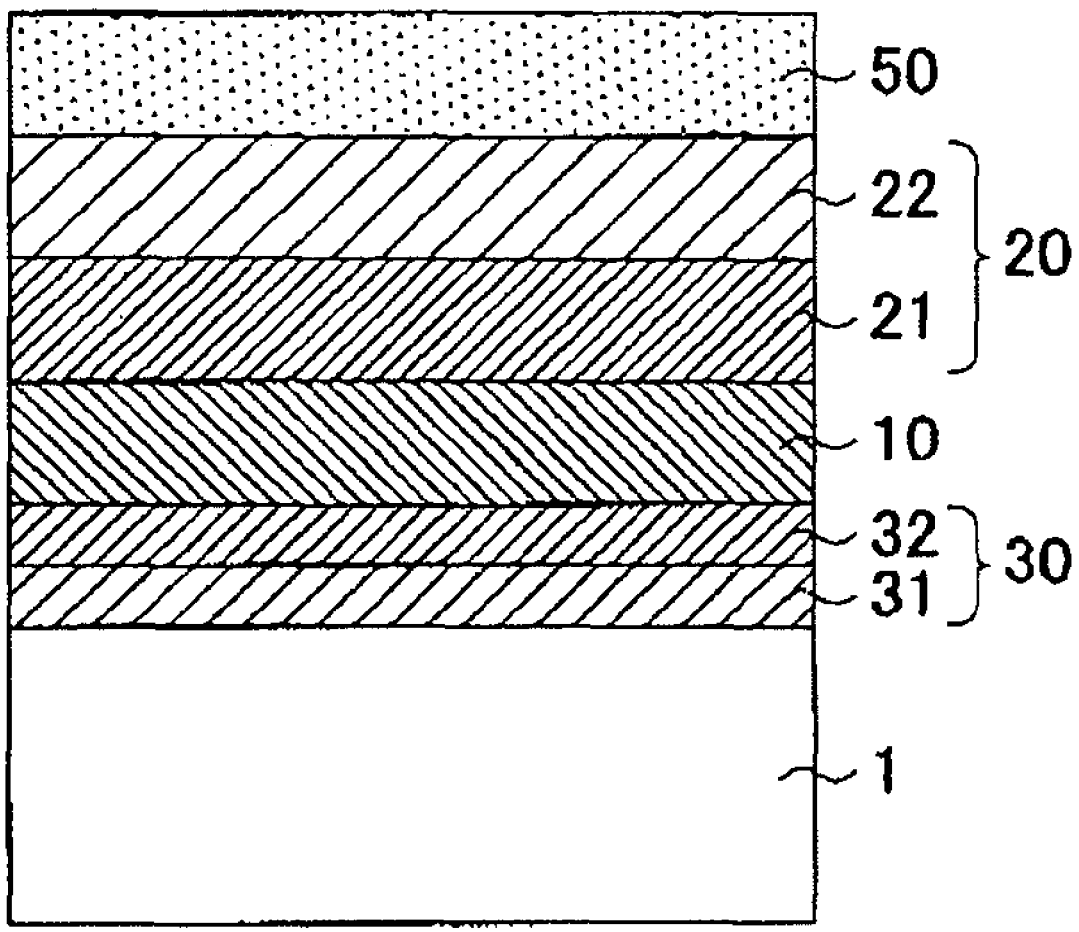
FIG. 3 is an exemplary sectional view showing one example of a photomask blank according to a fourth embodiment of this invention.

FIG. 3 shows one example of a photomask blank according to a fourth embodiment of this invention.

The photomask blank shown in FIG. 3 is used for manufacturing a phase shift mask of the type in which a substrate is not dug down and a high-transmittance phase shift portion is formed by providing a high-transmittance halftone phase shift film. In order to obtain high transmittance, the halftone phase shift film comprises two layers, i.e. a phase control layer and a transmittance control layer.

This photomask blank comprises a halftone phase shift film 30 composed of a phase control layer 32 and a transmittance control layer 31, an etching mask film 10, a Ta-based light-shielding film 20 composed of a Ta-based light-shielding layer 21 and a Ta-based antireflection layer 22, and a resist film 50 which are formed in this order on a surface of a transparent substrate 1.

FIG. 9K shows one example of a phase shift mask of this type. As shown in FIG. 9K, this type of phase shift mask has, on a substrate 1, a pattern 30*a* of a halftone phase shift film 30 composed of a phase control layer 32 and a transmittance control layer 31.

In this invention, as the material mainly containing tantalum, use can be made of a tantalum-based material, for example, tantalum alone or a material containing tantalum and at least one kind of elements such as oxygen, nitrogen, carbon, hydrogen, boron, and silicon (tantalum-containing material).

In this invention, as a film structure of the light-shielding film made of the material mainly containing tantalum, a multilayer structure made of the above film materials is often employed, but a single-layer structure may alternatively be employed. In the case of the multilayer structure, it is possible to use a multilayer structure with layers of stepwise different compositions or a film structure having a continuously varying composition.

In this invention, it is necessary that the etching mask film be made of the material being dry-etchable with the chlorine-based gas (including a mixed gas of a chlorine-based gas and an oxygen gas), but not dry-etchable with the fluorine-based gas and serve as an etching mask at least until the transfer pattern is formed in the phase shift film by the dry etching using the fluorine-based gas. As such an etching mask film, there can be cited a film made of chromium, hafnium, zirconium, an alloy containing such an element, or a material containing such an element or alloy (e.g. a material containing such an element or alloy and at least one of oxygen, nitrogen, silicon, and carbon).

On the other hand, use may be made, as the etching mask film, of a chromium-based material, a hafnium-based material, or a zirconium-based material etchable with the chlorine-based gas (including a mixed gas of a chlorine-based gas and an oxygen gas) and containing at least one kind of elements such as molybdenum, titanium, vanadium, and silicon for adjusting the fine structure and durability.

In this invention, it is preferable that the etching mask film can be stripped by dry etching or wet etching without damaging the substrate and other layers.

In this invention, the etching selectivity of the etching mask film to the substrate or other layer (etching rate of the etching mask film/etching rate of the substrate or other layer) is preferably ⅕ or less.

In this invention, the phase shift film is preferably made of a material that is substantially dry-etchable with the fluorine-based gas, but not substantially dry-etchable with the chlorine-based gas.

In this invention, use can be made, as the phase shift film, of, for example, a silicon-containing film containing silicon. As the silicon-containing film, there can be cited a silicon film, a metal silicide film containing silicon and a metal such as chromium, tantalum, molybdenum, titanium, hafnium, or tungsten, or a film containing at least one of oxygen, nitrogen, and carbon in a silicon film or a metal silicide film.

In this invention, use can be made, as the phase shift film, of, for example, a film mainly containing transition metal silicide oxide, transition metal silicide nitride, transition metal silicide oxynitride, transition metal silicide oxycarbide, transition metal silicide nitride carbide, or transition metal silicide oxycarbonitride. As the phase shift film, use can be made of, for example, a halftone film such as a molybdenum-based (MoSiON, MoSiN, MoSiO, or the like) film, a tungsten-based (WSiON, WSiN, WSiO, or the like) film, or a silicon-based (SiN, SiON, or the like) film.

In this invention, use can be made, as the phase shift film, of, for example, a halftone film composed of two layers, i.e. a phase adjusting layer for mainly controlling the phase of exposure light and a transmittance adjusting layer for mainly controlling the transmittance of exposure light.

In this invention, use can be made, as the phase shift film, of, for example, a halftone film composed of two layers, i.e. a phase adjusting layer for mainly controlling the phase of exposure light and a transmittance adjusting layer for mainly controlling the transmittance of exposure light (see JP-A-2003-322947). Herein, as a material of the transmittance adjusting layer, use can be made of a material containing one kind or two or more kinds selected from metals and silicon, or an oxide, nitride, oxynitride, carbide, or the like thereof. Specifically, there can be cited a material containing one kind or two or more kinds selected from aluminum, titanium, vanadium, chromium, zirconium, niobium, molybdenum, lanthanum, tantalum, tungsten, silicon, and hafnium, or an oxide, nitride, oxynitride, carbide, or the like thereof. As the phase adjusting layer, it is preferable to use a silicon-based thin film made of silicon oxide, silicon nitride, silicon oxynitride, or the like because relatively high transmittance can be easily obtained for exposure light in the ultraviolet region.

According to this invention of the third aspect, the light-shielding film preferably comprises:

a light-shielding layer mainly containing tantalum nitride; and an antireflection layer stacked on an upper surface of the light-shielding layer and mainly containing tantalum oxide.

According to this aspect, the tantalum-based light-shielding film can be formed by the TaN-based light-shielding layer made of a material dry-etchable with a chlorine-based gas containing no oxygen (including a chlorine-based gas containing substantially no oxygen, i.e. a chlorine-based gas containing oxygen in an amount not affecting a resist film and so on during dry etching) and the TaO-based front-surface antireflection layer formed on the upper surface of the TaN-based light-shielding layer and made of a material that is not substantially dry-etchable with a chlorine-based gas, but dry-etchable with a fluorine-based gas. When dry-etching the tantalum-based light-shielding film with the fluorine-based gas using as a mask a resist pattern formed on the TaO-based antireflection layer in contact therewith, it is sufficient to etch only the thin TaO-based antireflection layer, and therefore, the resist film thickness can be reduced as compared with the case where the entire tantalum-based light-shielding film (TaN-based light-shielding layer/TaO-based antireflection layer) is dry-etched using a fluorine-based gas and thus it becomes possible to achieve improvement in processing accuracy of the TaO-based antireflection layer.

Further, when dry-etching the TaN-based light-shielding layer with the chlorine-based gas containing substantially no oxygen using a TaO-based antireflection layer pattern as a mask, the TaO-based antireflection layer pattern is not dry-etched with the chlorine-based gas, i.e. it serves well as an etching mask. Therefore, it becomes possible to achieve improvement in processing accuracy of the TaN-based light-shielding layer.

Further, a pattern of the tantalum-based light-shielding film (TaN-based light-shielding layer/TaO-based antireflection layer) serves well as an etching mask when etching the etching mask film (e.g. a Cr-based thin film layer), formed under the tantalum-based light-shielding film in contact therewith, using a chlorine-based gas (e.g. $Cl_2+O_2$). Therefore, it becomes possible to achieve improvement in processing accuracy of the etching mask film (e.g. the Cr-based thin film layer).

In view of the above, this invention can provide methods of manufacturing a photomask blank and a photomask characterized in that a main light-shielding layer and an antireflection layer formed thereon both serve as etching mask layers for an underlayer, i.e. characterized by having a light-shielding film with a structure (configuration) in which two or more etching mask layers are stacked.

In view of the above, this invention can provide methods of manufacturing a photomask blank and a photomask characterized in that three layers, i.e. an etching mask film, a main light-shielding layer formed thereon, and an antireflection layer formed thereon, all serve as etching mask layers for an underlayer, i.e. characterized by having a processing and light-shielding film with a structure (configuration) in which three or more etching mask layers are stacked.

In addition to the above, according to Configuration 3, by forming the antireflection layer as a Ta oxide layer, it is possible to improve the resistance to hot water and alkali, which otherwise becomes a problem with an antireflection film of MoSiON or the like.

In addition to the above, according to Configuration 3, by providing the Ta-based light-shielding layer being a metal layer, the conductivity can be ensured so as to prevent charge-up during electron beam lithography on an electron beam resist formed in contact with the antireflection layer.

In this invention, the sheet resistance of the substrate formed with the antireflection layer is preferably 500 Ω/square or less.

According to this invention of the fourth aspect, the thickness of the light-shielding film is preferably 15 nm to 50 nm.

With respect to the upper limit, it is for providing a film thickness that enables removal of the tantalum-based light-shielding film (e.g. TaN-based light-shielding layer/TaO-based antireflection layer) during the dry etching using the fluorine-based gas for forming the phase shift pattern.

With respect to the lower limit, it is for ensuring the optical density and the function as a charge-up preventing layer.

According to this invention of the fifth aspect, the etching mask film is preferably made of a material mainly containing one of chromium, chromium nitride, chromium oxide, chromium oxynitride, and chromium oxycarbonitride.

According to this aspect, the etching mask film can be reduced in thickness. Further, it is excellent in processing accuracy. In addition, the etching selectivity of the etching mask film to the upper and lower layers formed in contact therewith is high and, therefore, the etching mask film that becomes unnecessary can be removed without damaging the substrate and other layers.

In this invention, as the etching mask film, use can be made of a chromium-based material, for example, chromium alone or a material containing chromium and at least one kind of elements such as oxygen, nitrogen, carbon, and hydrogen (Cr-containing material).

As a film structure of the etching mask film, a single-layer structure made of the above film material is often employed, but a multilayer structure may alternatively be employed. In the case of the multilayer structure, it is possible to use a multilayer structure with layers of stepwise different compositions or a film structure having a continuously varying composition.

As the material of the etching mask film, chromium oxycarbonitride (CrOCN) is preferable among them in terms of stress controllability (low-stress film can be formed).

According to this invention of the sixth aspect, the etching mask film preferably has a thickness of 5 nm to 40 nm.

According to this aspect, the etching mask film is excellent in processing accuracy and serves as an etching mask for the phase shift film.

According to this invention of the seventh aspect, the phase shift film is preferably made of a material mainly containing one of molybdenum silicide, molybdenum silicide nitride, molybdenum silicide oxide, and molybdenum silicide oxynitride.

According to this configuration, there is obtained a halftone phase shift mask having a transmittance of, for example, about 3% to 20% for ArF exposure light.

According to this invention of the eighth aspect, the phase shift film preferably comprises a phase adjusting layer made of a material mainly containing silicon oxide or silicon oxynitride and a transmittance adjusting layer made of a material mainly containing tantalum or a tantalum-hafnium alloy.

According to this configuration, it becomes possible to obtain a high-transmittance halftone phase shift mask, for example, having a transmittance of 20% or more for ArF exposure light without digging down a substrate.

According to this invention of the ninth aspect, a photomask is manufactured using the photomask blank according to the aforementioned aspects.

According to this aspect, there is obtained a photomask having the same operation and effect as those of any of aspects 1 to 8 described above.

According to this invention, there is provided a photomask manufacturing method, comprising the steps of:

dry-etching the light-shielding film using a resist film pattern as a mask, thereby forming a light-shielding film pattern;

dry-etching the etching mask film using the light-shielding film pattern as a mask, thereby forming an etching mask film pattern; and dry-etching the light-transmitting substrate using the etching mask film pattern as a mask, thereby forming a dug-down part that is dug down from a surface of the light-transmitting substrate to a digging depth adapted to produce a predetermined phase difference.

According to this method, a photomask having the same operation and effect as those of any of the aforementioned aspects 1 to 8 is obtained with high manufacturing process efficiency.

According to this invention, there is provided another photomask manufacturing method, comprising the steps of:

dry-etching the light-shielding film using a resist film pattern as a mask, thereby forming a light-shielding film pattern;

dry-etching the etching mask film using the light-shielding film pattern as a mask, thereby forming an etching mask film pattern; and dry-etching the phase shift film using the etching mask film pattern as a mask, thereby forming a phase shift film pattern.

According to this method, a photomask having the same operation and effect as those of any of the aforementioned aspects 1 to 8 is obtained with high manufacturing process efficiency.

In this invention, for dry-etching a chromium-based thin film, it is preferable to use a dry etching gas in the form of a mixed gas containing a chlorine-based gas and an oxygen gas. This is because if a chromium-based thin film made of a material containing chromium and an element such as oxygen or nitrogen is dry-etched using the above dry etching gas, it is possible to increase the dry etching rate and thus to shorten the dry etching time so that an etching mask film pattern with an excellent sectional shape can be formed. As the chlorine-based gas for use in the dry etching, there can be cited, for example, $Cl_2$, $SiCl_4$, HCl, $CCl_4$, $CHCl_3$, or the like.

In this invention, for dry-etching a substrate to form a dug-down part or dry-etching a silicon-containing film containing silicon or a metal silicide-based thin film, use can be made of, for example, a fluorine-based gas such as $SF_6$, $CF_4$, $C_2F_6$, or $CHF_3$, a mixed gas of such a fluorine-based gas and He, $H_2$, $N_2$, Ar, $C_2H_4$, $O_2$ or the like, a chlorine-based gas such as $Cl_2$ or $CH_2Cl_2$, or a mixed gas of such a chlorine-based gas and He, $H_2$, $N_2$, Ar, $C_2H_4$, or the like.

In this invention, the resist is preferably a chemically amplified resist. This is because it is suitable for high-accuracy processing.

This invention is applied to photomask blanks of the generation aiming at a resist film thickness of 200 nm or less and further at a resist film thickness of 150 nm.

In this invention, the resist is preferably a resist for electron beam lithography. This is because it is suitable for high-accuracy processing.

This invention is applied to a photomask blank for electron beam lithography, wherein a resist pattern is formed by electron beam lithography.

In this invention, as a substrate, there can be cited a synthetic quartz substrate, a $CaF_2$ substrate, a soda-lime glass substrate, an alkali-free glass substrate, a low thermal expansion glass substrate, an aluminosilicate glass substrate, or the like.

In this invention, photomask blanks include the above various phase shift mask blanks and resist-coated mask blanks.

In this invention, photomasks include the above various phase shift masks. A reticle is included in the photomasks. The phase shift masks include a phase shift mask in which a phase shift portion is formed by digging down a substrate.

Hereinbelow, Examples of this invention and Comparative Examples thereof will be shown. In each Example, films such as a light-shielding film, an etching mask film, and a phase shift film were formed by a sputtering method as a film forming method using a DC magnetron sputtering apparatus as a sputtering apparatus. However, for carrying out this invention, there is no particular limitation to such a film forming method and film forming apparatus and use may be made of another type of sputtering apparatus such as an RF magnetron sputtering apparatus.

Example 1

Example 1 relates to a method of manufacturing a photomask blank for use in manufacturing a phase shift mask of the type having a phase shift portion configured by forming a dug-down part on a substrate and further relates to a method of manufacturing the photomask.

[Manufacture of Photomask Blank]

Referring to FIGS. 4A to 4I, description will be given of photomask blank and photomask manufacturing methods according to Example 1 of this invention.

First, a substrate made of quartz was mirror-polished and then cleaned, thereby obtaining a light-transmitting substrate 1 of 6 inches×6 inches×0.25 inches (FIG. 4A).

Then, using a DC magnetron sputtering apparatus, an etching mask film 10 was formed on the light-transmitting substrate 1 (FIG. 4A). Specifically, using a chromium target, CrOCN was formed to a thickness of 20 nm under the conditions of introducing gases and flow rates of Ar=18 sccm, $CO_2$=18 sccm, $N_2$=10 sccm and a sputtering power of 1.7 kW. In this event, the film stress of the CrOCN film was adjusted to be as small as possible (preferably, substantially zero).

Then, the substrate 1 formed with the etching mask film 10 was introduced into a DC magnetron sputtering apparatus. After the inside of the sputtering apparatus was evacuated to $2×10^{-5}$ (Pa) or less, a mixed gas of Xe and $N_2$ was introduced into the sputtering apparatus. In this event, the flow rate of Xe and the flow rate of $N_2$ were adjusted to 12.7 sccm and 10 sccm, respectively. Ta was used as a sputtering target. After the gas flow rates were stabilized, the power of a DC power supply was set to 1.5 kW, thereby forming a tantalum nitride (TaN) layer 21 having a thickness of 24 nm on the etching mask film 10 (FIG. 4A).

Then, while the substrate 1 formed with the tantalum nitride (TaN) layer 21 was maintained in the sputtering apparatus, a mixed gas containing an Ar gas at a flow rate of 90 sccm and an $O_2$ gas at a flow rate of 34.7 sccm was introduced into the sputtering apparatus and then the power of the DC power supply was set to 0.7 kW, thereby stacking a tantalum oxide (TaO) layer 22 having a thickness of 10 nm on the tantalum nitride (TaN) layer 21 (FIG. 4A).

In the manner described above, there was formed a tantalum-based light-shielding film 20 comprising the tantalum nitride (TaN) layer 21 and the tantalum oxide (TaO) layer 22 stacked together.

The reflectance (front-surface reflectance) of a surface, remote from the substrate 1, of the light-shielding film 20 thus formed was 25.7% for ArF exposure light (wavelength: 193 nm). Further, the transmittance for ArF exposure light was 0.1%. AES (Auger electron spectroscopy) analysis was performed, wherein the N content of the tantalum nitride (TaN) layer 21 was 23 at % and the O content of the tantalum oxide (TaO) layer 22 was 65 at %.

The sheet resistance was measured for the sample at the stage where the tantalum oxide (TaO) layer 22 was formed, and it was 85 Ω/square.

[Manufacture of Photomask]

As shown in FIG. 4A, using a photomask blank thus manufactured, a chemically amplified positive resist 50 for electron beam lithography (exposure) (FEP171: manufactured by FUJIFILM Electronic Materials Co., Ltd.) was applied to a thickness of 150 nm on the tantalum oxide (TaO) layer 22 by a spin-coating method.

Then, using an electron beam lithography apparatus, pattern writing was performed on the resist film 50 and, thereafter, development was carried out using a predetermined developer, thereby forming a resist pattern 50a (FIG. 4B).

Then, using the resist pattern 50a as a mask, the tantalum-based film 20 having the TaN and TaO layers stacked together was dry-etched, thereby forming a tantalum-based film pattern 20a (tantalum nitride (TaN) layer pattern 21a/tantalum oxide (TaO) layer pattern 22a) (FIG. 4C). In this event, $CHF_3$ was used as a dry etching gas.

Then, using the resist pattern 50a and the tantalum-based film pattern 20a as a mask, the chromium-based etching mask film 10 was dry-etched, thereby forming a chromium-based etching mask film pattern 10a (FIG. 4D). In this event, a mixed gas of $Cl_2$ and $O_2$ ($Cl_2:O_2=4:1$) was used as a dry etching gas.

Then, as shown in FIG. 4E, the resist pattern 50a that became unnecessary was stripped and then a chemically amplified positive resist 51 for electron beam lithography (exposure) (FEP171: manufactured by FUJIFILM Electronic Materials Co., Ltd.) was applied again to a thickness of 150 nm by the spin-coating method.

Then, using the electron beam lithography apparatus, pattern writing was performed on the resist film 51 and, thereafter, development was carried out using the predetermined developer, thereby forming a resist pattern 51a (FIG. 4F). Herein, the resist pattern 51a was formed for the purpose of forming a light-shielding band in the peripheral region of the substrate and forming a large-area patch pattern of a light-shielding portion or a zebra pattern for controlling transmittance.

Then, using the chromium-based etching mask film pattern 10a as a mask, the light-transmitting substrate 1 was dry-etched with a $CHF_3$ gas, thereby obtaining a phase shift pattern (phase shift portion) of the substrate dug-down type (FIG. 4G). In this event, the light-transmitting substrate 1 was etched to a depth adapted to obtain a phase difference of 180° for ArF exposure light (193 nm) (specifically, a depth of 170 nm), thereby forming a dug-down part 1a on the light-transmitting substrate 1 to provide the phase shift pattern (phase shift portion). During this dry etching, the tantalum-based film pattern 20a (tantalum nitride (TaN) layer pattern 21a/tantalum oxide (TaO) layer pattern 22a) gradually disappeared by the dry etching and, at the completion of the etching of the light-transmitting substrate 1, the TaO/TaN film at a portion with no resist pattern 51a fully disappeared (FIG. 4G). This is because the etching depth 170 nm of the light-transmitting substrate 1 is sufficiently large with respect to the total thickness 34 nm of the TaO/TaN film and thus the etching time is sufficiently long.

Then, the etching mask film pattern 10a at a portion with no resist pattern 51a was stripped by dry etching with a mixed gas of $Cl_2$ and $O_2$ ($Cl_2:O_2=4:1$) (FIG. 4H).

Then, the resist pattern 51a was stripped (FIG. 4I) and then cleaning was carried out, thereby obtaining a photomask 100.

[Evaluation]

The photomask obtained in Example 1 was evaluated.

As a result, with respect to the resolution of the phase shift pattern (phase shift portion) of the substrate dug-down type formed on the photomask, it was possible to resolve a phase shift pattern of 50 nm.

Simultaneously, the transmittance for ArF exposure light was 0.1% at the light-shielding portion formed by the chromium-based etching mask film 10 and the tantalum-based film 20 stacked together and it was possible to achieve an optical density OD=3.0.

In the manufacturing processes of the photomask of Example 1, the resist pattern 50a was stripped after forming the etching mask film pattern 10a (between the processes of FIGS. 4D and 4E). However, the resist pattern 50a may be stripped after forming the tantalum-based film pattern 20a (between the processes of FIGS. 4C and 4D). The processing accuracy is further improved.

In the configuration shown in FIG. 4G of Example 1, there is obtained a photomask similar to the so-called zebra type, wherein the phase shift pattern of the substrate dug-down type has the etching mask film pattern 10a made of the chromium-based light-shielding material. However, in this case, the optical density of the etching mask film pattern 10a made of the chromium-based light-shielding material is less than 3.

Example 2

Example 2 relates to a method of manufacturing a photomask blank for use in manufacturing a phase shift mask of the type having a phase shift portion configured by forming a dug-down part on a substrate and further relates to a method of manufacturing the photomask. As compared with Example 1, Example 2 differs in the film forming conditions of a tantalum nitride (TaN) layer 21, the thickness thereof, and an etching gas used in etching thereof.

[Manufacture of Photomask Blank]

Referring to FIGS. 5A to 5J, description will be given of photomask blank and photomask manufacturing methods according to Example 2 of this invention.

First, a substrate made of quartz was mirror-polished and then cleaned, thereby obtaining a light-transmitting substrate 1 of 6 inches×6 inches×0.25 inches (FIG. 5A).

Then, using a DC magnetron sputtering apparatus, an etching mask film 10 was formed on the light-transmitting substrate 1 (FIG. 5A). Specifically, using a chromium target, CrOCN was formed to a thickness of 20 nm under the conditions of introducing gases and flow rates of Ar=18 sccm, $CO_2$=18 sccm, $N_2$=10 sccm and a sputtering power of 1.7 kW. In this event, the film stress of the CrOCN film was adjusted to be as small as possible (preferably, substantially zero).

Then, the substrate 1 formed with the etching mask film 10 was introduced into a DC magnetron sputtering apparatus. After the inside of the sputtering apparatus was evacuated to $2\times10^{-5}$ (Pa) or less, a mixed gas of Xe and $N_2$ was introduced into the sputtering apparatus. In this event, the flow rate of Xe and the flow rate of $N_2$ were adjusted to 12.9 sccm and 5 sccm, respectively. Ta was used as a sputtering target. After the gas flow rates were stabilized, the power of a DC power supply was set to 1.5 kW, thereby forming a tantalum nitride (TaN) layer 21 having a thickness of 23 nm on the etching mask film 10 (FIG. 5A).

Then, while the substrate 1 formed with the tantalum nitride (TaN) layer 21 was maintained in the sputtering apparatus, a mixed gas containing an Ar gas at a flow rate of 90 sccm and an $O_2$ gas at a flow rate of 34.7 sccm was introduced into the sputtering apparatus and then the power of the DC power supply was set to 0.7 kW, thereby stacking a tantalum oxide (TaO) layer 22 having a thickness of 10 nm on the tantalum nitride (TaN) layer 21 (FIG. 5A).

In the manner described above, there was formed a tantalum-based light-shielding film 20 comprising the tantalum nitride (TaN) layer 21 and the tantalum oxide (TaO) layer 22 stacked together.

The reflectance (front-surface reflectance) of a surface, remote from the substrate 1, of the light-shielding film 20 thus formed was 25.3% for ArF exposure light (wavelength: 193 nm). Further, the transmittance for ArF exposure light was 0.1%. AES (Auger electron spectroscopy) analysis was performed, wherein the N content of the tantalum nitride (TaN) layer 21 was 15 at % and the O content of the tantalum oxide (TaO) layer 22 was 65 at %.

The sheet resistance was measured for the sample at the stage where the tantalum oxide (TaO) layer 22 was formed, and it was 90 Ω/square.

[Manufacture of Photomask]

As shown in FIG. 5A, using a photomask blank thus manufactured, a chemically amplified positive resist 50 for electron beam lithography (exposure) (FEP171: manufactured by FUJIFILM Electronic Materials Co., Ltd.) was applied to a thickness of 150 nm on the tantalum oxide (TaO) layer 22 by a spin-coating method.

Then, using an electron beam lithography apparatus, pattern writing was performed on the resist film 50 and, thereafter, development was carried out using a predetermined developer, thereby forming a resist pattern 50a (FIG. 5B).

Then, using the resist pattern 50a as a mask, the tantalum oxide (TaO) layer 22 was dry-etched with $CHF_3$ used as an etching gas, thereby forming a tantalum oxide (TaO) layer pattern 22a (FIG. 5C).

Subsequently, using the resist pattern 50a and the tantalum oxide (TaO) layer pattern 22a as a mask, the tantalum nitride (TaN) layer 21 was dry-etched with $Cl_2$ used as an etching gas, thereby forming a tantalum nitride (TaN) layer pattern 21a (FIG. 5D).

Then, using the resist pattern 50a and a tantalum-based film pattern 20a (tantalum nitride (TaN) layer pattern 21a/tantalum oxide (TaO) layer pattern 22a) as a mask, the chromium-based etching mask film 10 was dry-etched, thereby forming a chromium-based etching mask film pattern 10a (FIG. 5E). In this event, a mixed gas of $Cl_2$ and $O_2$ ($Cl_2:O_2=4:1$) was used as a dry etching gas.

Then, as shown in FIG. 5F, the resist pattern 50a that became unnecessary was stripped and then a chemically amplified positive resist 51 for electron beam lithography (exposure) (FEP171: manufactured by FUJIFILM Electronic Materials Co., Ltd.) was applied again to a thickness of 150 nm by the spin-coating method.

Then, using the electron beam lithography apparatus, pattern writing was performed on the resist film 51 and, thereafter, development was carried out using the predetermined developer, thereby forming a resist pattern 51a (FIG. 5G). Herein, the resist pattern 51a is formed for the purpose of forming a light-shielding band in the peripheral region of the substrate and forming a large-area patch pattern of a light-shielding portion or a zebra pattern for controlling transmittance.

Then, using the chromium-based etching mask film pattern 10a as a mask, the light-transmitting substrate 1 was dry-etched with a $CHF_3$ gas, thereby obtaining a phase shift pattern (phase shift portion) of the substrate dug-down type (FIG. 5H). In this event, the light-transmitting substrate 1 was etched to a depth adapted to obtain a phase difference of 180° for ArF exposure light (193 nm) (specifically, a depth of 170 nm), thereby forming a dug-down part 1a on the light-transmitting substrate 1 to provide the phase shift pattern (phase shift portion). During this dry etching, the tantalum-based film pattern 20a (tantalum nitride (TaN) layer pattern 21a/tantalum oxide (TaO) layer pattern 22a) gradually disappeared by the dry etching and, at the completion of the etching of the light-transmitting substrate 1, the TaO/TaN film at a portion with no resist pattern 51a fully disappeared (FIG. 5H). This is because the etching depth 170 nm of the light-transmitting substrate 1 is sufficiently large with respect to the total thickness 33 nm of the TaO/TaN film and thus the etching time is sufficiently long.

Then, the etching mask film pattern 10a at a portion with no resist pattern 51a was stripped by dry etching with a mixed gas of $Cl_2$ and $O_2$ ($Cl_2:O_2=4:1$) (FIG. 5I).

Then, the resist pattern 51a was stripped (FIG. 5J) and then cleaning was carried out, thereby obtaining a photomask 100.

[Evaluation]

The photomask obtained in Example 2 was evaluated.

As a result, with respect to the resolution of the phase shift pattern (phase shift portion) of the substrate dug-down type formed on the photomask, it was possible to resolve a phase shift pattern of 50 nm.

Simultaneously, the transmittance for ArF exposure light was 0.1% at the light-shielding portion formed by the chromium-based etching mask film 10 and the tantalum-based film 20 stacked together and it was possible to achieve an optical density OD=3.0.

In the manufacturing processes of the photomask of Example 2, the resist pattern 50a was stripped after forming the etching mask film pattern 10a (between the processes of FIGS. 5E and 5F). However, the resist pattern 50a may be stripped after forming the tantalum oxide (TaO) layer pattern 22a (between the processes of FIGS. 5C and 5D). The processing accuracy is further improved.

Example 3

Example 3 relates to a method of manufacturing a photomask blank for use in manufacturing a phase shift mask of the type in which a substrate is not basically dug down and a phase shift portion is formed by a halftone phase shift film, and further relates to a method of manufacturing the photomask.

[Manufacture of Photomask Blank]

Referring to FIGS. 6A to 6I, description will be given of photomask blank and photomask manufacturing methods according to Example 3 of this invention.

First, a substrate made of quartz was mirror-polished and then cleaned, thereby obtaining a light-transmitting substrate 1 of 6 inches×6 inches×0.25 inches (FIG. 6A).

Then, using a mixed target of molybdenum (Mo) and silicon (Si) (Mo:Si=1:9 [at %]), reactive sputtering was carried out in a mixed gas atmosphere of argon (Ar) and nitrogen ($N_2$) (Ar:$N_2$=10:90 [vol %]; pressure: 0.3 [Pa]), thereby forming a MoSiN-based light-semitransmitting phase shift film 30 having a thickness of 68 nm on the light-transmitting substrate 1 (FIG. 6A). In this event, the thickness of the phase shift film 30 was adjusted so as to obtain a phase difference of 180° for ArF exposure light (wavelength: 193 nm). The transmittance of the phase shift film 30 for ArF exposure light (wavelength: 193 nm) was 6%.

Then, using a DC magnetron sputtering apparatus, an etching mask film 10 was formed on the phase shift film 30 (FIG. 6A). Specifically, using a chromium target, CrOCN was formed to a thickness of 15 nm under the conditions of introducing gases and flow rates of Ar=18 sccm, $CO_2$=18 sccm, $N_2$=10 sccm and a sputtering power of 1.7 kW. In this event, the film stress of the CrOCN film was adjusted to be as small as possible (preferably, substantially zero).

Then, the substrate 1 formed with the etching mask film 10 was introduced into a DC magnetron sputtering apparatus. After the inside of the sputtering apparatus was evacuated to $2\times10^{-5}$ (Pa) or less, a mixed gas of Xe and $N_2$ was introduced into the sputtering apparatus. In this event, the flow rate of Xe and the flow rate of $N_2$ were adjusted to 12.7 sccm and 5 sccm, respectively. Ta was used as a sputtering target. After the gas flow rates were stabilized, the power of a DC power supply was set to 1.5 kW, thereby forming a tantalum nitride (TaN) layer 21 having a thickness of 10 nm on the etching mask film 10 (FIG. 6A).

Then, while the substrate 1 formed with the tantalum nitride (TaN) layer 21 was maintained in the sputtering apparatus, a mixed gas containing an Ar gas at a flow rate of 90 sccm and an $O_2$ gas at a flow rate of 34.7 sccm was introduced into the sputtering apparatus and then the power of the DC power supply was set to 0.7 kW, thereby stacking a tantalum oxide (TaO) layer 22 having a thickness of 10 nm on the tantalum nitride (TaN) layer 21 (FIG. 6A).

In the manner described above, there was formed a tantalum-based light-shielding film 20 comprising the tantalum nitride (TaN) layer 21 and the tantalum oxide (TaO) layer 22 stacked together.

The reflectance (front-surface reflectance) of a surface, remote from the substrate 1, of the light-shielding film 20 thus formed was 26.2% for ArF exposure light (wavelength: 193 nm). Further, the transmittance for ArF exposure light was 0.1%. AES (Auger electron spectroscopy) analysis was performed, wherein the N content of the tantalum nitride (TaN) layer 21 was 23 at % and the O content of the tantalum oxide (TaO) layer 22 was 65 at %.

The sheet resistance was measured for the sample at the stage where the tantalum oxide (TaO) layer 22 was formed, and it was 160 Ω/square.

[Manufacture of Photomask]

As shown in FIG. 6A, using a photomask blank thus manufactured, a chemically amplified positive resist 50 for electron beam lithography (exposure) (PRL009: manufactured by FUJIFILM Electronic Materials Co., Ltd.) was applied to a thickness of 120 nm on the tantalum oxide (TaO) layer 22 by a spin-coating method.

Then, using an electron beam lithography apparatus, pattern writing was performed on the resist film 50 and, thereafter, development was carried out using a predetermined developer, thereby forming a resist pattern 50a (FIG. 6B).

Then, using the resist pattern 50a as a mask, the tantalum-based film 20 having the TaN and TaO layers stacked together was dry-etched, thereby forming a tantalum-based film pattern 20a (tantalum nitride (TaN) layer pattern 21a/tantalum oxide (TaO) layer pattern 22a) (FIG. 6C). In this event, $CHF_3$ was used as a dry etching gas.

Then, using the resist pattern 50a and the tantalum-based film pattern 20a as a mask, the chromium-based etching mask film 10 was dry-etched, thereby forming a chromium-based etching mask film pattern 10a (FIG. 6D). In this event, a mixed gas of $Cl_2$ and $O_2(Cl_2:O_2=4:1)$ was used as a dry etching gas.

Then, as shown in FIG. 6E, the resist pattern 50a that became unnecessary was stripped and then a chemically amplified positive resist 51 for electron beam lithography (exposure) (FEP171: manufactured by FUJIFILM Electronic Materials Co., Ltd.) was applied again to a thickness of 150 nm by the spin-coating method.

Then, using the electron beam lithography apparatus, pattern writing was performed on the resist film 51 and, thereafter, development was carried out using a predetermined developer, thereby forming a resist pattern 51a (FIG. 6F). Herein, the resist pattern 51a was formed at a portion where the light-shielding film pattern was to remain.

Then, using the chromium-based etching mask film pattern 10a as a mask, the phase shift film 30 was dry-etched with two kinds of fluorine-based gases, thereby forming a phase shift film pattern (phase shift portion) 30a (FIG. 6G). In this event, the dry etching was performed using a mixed gas of a $CHF_3$ gas and a He gas until the tantalum oxide (TaO) layer pattern 22a disappeared by the etching. After the tantalum oxide (TaO) layer pattern 22a disappeared, the dry etching was performed using a mixed gas of a $SF_6$ gas and a He gas. During the dry etching, the tantalum-based film pattern 20a (tantalum nitride (TaN) layer pattern 21a/tantalum oxide (TaO) layer pattern 22a) gradually disappeared by the dry etching and, at the completion of the etching of the phase shift film 30, the TaO/TaN film at a portion with no resist pattern 51a fully disappeared (FIG. 6G). This is because the thickness 68 nm of the MoSiN-based phase shift film 30 is sufficiently large with respect to the total thickness 20 nm of the TaO/TaN film and thus the etching time is sufficiently long.

Then, the etching mask film pattern 10a at a portion with no resist pattern 51a was stripped by dry etching with a mixed gas of $Cl_2$ and $O_2(Cl_2:O_2=4:1)$ (FIG. 6H).

Then, the resist pattern 51a was stripped (FIG. 6I) and then cleaning was carried out, thereby obtaining a photomask 100.

[Evaluation]

The photomask obtained in Example 3 was evaluated.

As a result, with respect to the resolution of the phase shift film pattern (phase shift portion) 30a formed on the photomask, it was possible to resolve a phase shift film pattern of 40 nm.

Simultaneously, the transmittance for ArF exposure light was 0.1% at the light-shielding portion formed by the halftone phase shift film 30, the chromium-based etching mask film 10, and the tantalum-based film 20 stacked together and it was possible to achieve an optical density OD=3.0.

In the manufacturing processes of the photomask of Example 3, the resist pattern 50a was stripped after forming the etching mask film pattern 10a (between the processes of FIGS. 6D and 6E). However, the resist pattern 50a may be stripped after forming the tantalum-based film pattern 20a (between the processes of FIGS. 6C and 6D). The processing accuracy is further improved.

Example 4

Example 4 relates to a method of manufacturing a photomask blank for use in manufacturing a phase shift mask of the type in which a substrate is not basically dug down and a phase shift portion is formed by a halftone phase shift film, and further relates to a method of manufacturing the photomask. As compared with Example 3, Example 4 differs in the thickness of a tantalum nitride (TaN) layer 21 and an etching gas used in etching thereof.

[Manufacture of Photomask Blank]

Referring to FIGS. 7A to 7J, description will be given of photomask blank and photomask manufacturing methods according to Example 4 of this invention.

First, a substrate made of quartz was mirror-polished and then cleaned, thereby obtaining a light-transmitting substrate 1 of 6 inches×6 inches×0.25 inches (FIG. 7A).

Then, using a mixed target of molybdenum (Mo) and silicon (Si) (Mo:Si=1:9 [at %]), reactive sputtering was carried out in a mixed gas atmosphere of argon (Ar), nitrogen ($N_2$), and oxygen ($O_2$) (Ar:$N_2$:$O_2$=10:80:10 [vol %]; pressure: 0.3 [Pa]), thereby forming a MoSiON-based light-semitransmitting phase shift film 30 having a thickness of 89 nm on the light-transmitting substrate 1 (FIG. 7A). In this event, the thickness of the phase shift film 30 was adjusted so as to obtain a phase difference of 180° for ArF exposure light (wavelength: 193 nm). The transmittance of the phase shift film 30 for ArF exposure light (wavelength: 193 nm) was 15%.

Then, using a DC magnetron sputtering apparatus, an etching mask film 10 was formed on the phase shift film 30 (FIG. 7A). Specifically, using a chromium target, CrOCN was formed to a thickness of 15 nm under the conditions of introducing gases and flow rates of Ar=18 sccm, $CO_2$=18 sccm, $N_2$=10 sccm and a sputtering power of 17 kW. In this event, the film stress of the CrOCN film was adjusted to be as small as possible (preferably, substantially zero).

Then, the substrate 1 formed with the etching mask film 10 was introduced into a DC magnetron sputtering apparatus. After the inside of the sputtering apparatus was evacuated to $2\times10^{-5}$ (Pa) or less, a mixed gas of Xe and $N_2$ was introduced into the sputtering apparatus. In this event, the flow rate of Xe and the flow rate of $N_2$ were adjusted to 12.7 sccm and 5 sccm, respectively. Ta was used as a sputtering target. After the gas flow rates were stabilized, the power of a DC power supply was set to 1.5 kW, thereby forming a tantalum nitride (TaN) layer 21 having a thickness of 12 nm on the etching mask film 10 (FIG. 7A).

Then, while the substrate 1 formed with the tantalum nitride (TaN) layer 21 was maintained in the sputtering apparatus, a mixed gas containing an Ar gas at a flow rate of 90 sccm and an $O_2$ gas at a flow rate of 34.7 sccm was introduced into the sputtering apparatus and then the power of the DC power supply was set to 0.7 kW, thereby stacking a tantalum oxide (TaO) layer 22 having a thickness of 10 nm on the tantalum nitride (TaN) layer 21 (FIG. 7A).

In the manner described above, there was formed a tantalum-based light-shielding film 20 comprising the tantalum nitride (TaN) layer 21 and the tantalum oxide (TaO) layer 22 stacked together.

The reflectance (front-surface reflectance) of a surface, remote from the substrate 1, of the light-shielding film 20 thus formed was 26.2% for ArF exposure light (wavelength: 193 nm). Further, the transmittance for ArF exposure light was 0.1%. AES (Auger electron spectroscopy) analysis was performed, wherein the N content of the tantalum nitride (TaN) layer 21 was 15 at % and the O content of the tantalum oxide (TaO) layer 22 was 65 at %.

The sheet resistance was measured for the sample at the stage where the tantalum oxide (TaO) layer 22 was formed, and it was 150 Ω/square.

[Manufacture of Photomask]

As shown in FIG. 7A, using a photomask blank thus manufactured, a chemically amplified positive resist 50 for electron beam lithography (exposure) (FEP171: manufactured by FUJIFILM Electronic Materials Co., Ltd.), was applied to a thickness of 150 nm on the tantalum oxide (TaO) layer 22 by a spin-coating method.

Then, using an electron beam lithography apparatus, pattern writing was performed on the resist film 50 and, thereafter, development was carried out using a predetermined developer, thereby forming a resist pattern 50a (FIG. 7B).

Then, using the resist pattern 50a as a mask, the tantalum oxide (TaO) layer 22 was dry-etched with $CHF_3$ used as an etching gas, thereby forming a tantalum oxide (TaO) layer pattern 22a (FIG. 7C).

Subsequently, using the resist pattern 50a and the tantalum oxide (TaO) layer pattern 22a as a mask, the tantalum nitride (TaN) layer 21 was dry-etched with $Cl_2$ used as an etching gas, thereby forming a tantalum nitride (TaN) layer pattern 21a (FIG. 7D).

Then, using the resist pattern 50a and a tantalum-based film pattern 20a (tantalum nitride (TaN) layer pattern 21a/tantalum oxide (TaO) layer pattern 22a) as a mask, the chromium-based etching mask film 10 was dry-etched, thereby forming a chromium-based etching mask film pattern 10a (FIG. 7E). In this event, a mixed gas of $Cl_2$ and $O_2$($Cl_2$:$O_2$=4:1) was used as a dry etching gas.

Then, as shown in FIG. 7F, the resist pattern 50a that became unnecessary was stripped and then a chemically amplified positive resist 51 for electron beam lithography (exposure) (FEP171: manufactured by FUJIFILM Electronic Materials Co., Ltd.) was applied again to a thickness of 150 nm by the spin-coating method.

Then, using the electron beam lithography apparatus, pattern writing was performed on the resist film 51 and, thereafter, development was carried out using the predetermined developer, thereby forming a resist pattern 51a (FIG. 7G). Herein, the resist pattern 51a was formed at a portion where the light-shielding film pattern was to remain.

Then, using the chromium-based etching mask film pattern 10a as a mask, the phase shift film 30 was dry-etched with a $SF_6$ gas, thereby forming a phase shift film pattern (phase shift portion) 30a (FIG. 7H). During this dry etching, the tantalum-based film pattern 20a (tantalum nitride (TaN) layer pattern 21a/tantalum oxide (TaO) layer pattern 22a) gradually disappeared by the dry etching and, at the completion of the etching of the phase shift film 30, the TaO/TaN film at a portion with no resist pattern 51a fully disappeared (FIG. 7H). This is because the thickness 89 nm of the MoSiON-based phase shift film 30 is sufficiently large with respect to the total thickness 22 nm of the TaO/TaN film and thus the etching time is sufficiently long.

Then, the etching mask film pattern 10a at a portion with no resist pattern 51a was stripped by dry etching with a mixed gas of $Cl_2$ and $O_2$($Cl_2$:$O_2$=4:1) (FIG. 7I).

Then, the resist pattern 51a was stripped (FIG. 7J) and then cleaning was carried out, thereby obtaining a photomask 100.

[Evaluation]

The photomask obtained in Example 4 was evaluated.

As a result, with respect to the resolution of the phase shift film pattern (phase shift portion) 30a formed on the photomask, it was possible to resolve a phase shift film pattern of 50 nm.

Simultaneously, the transmittance for ArF exposure light was 0.1% at the light-shielding portion formed by the halftone phase shift film 30, the chromium-based etching mask film 10, and the tantalum-based film 20 stacked together and it was possible to achieve an optical density OD=3.0.

In the manufacturing processes of the photomask of Example 4, the resist pattern 50a was stripped after forming the etching mask film pattern 10a (between the processes of FIGS. 7E and 7F). However, the resist pattern 50a may be stripped after forming the tantalum oxide (TaO) layer pattern 22a (between the processes of FIGS. 7C and 7D). The processing accuracy is further improved.

(Chemical Resistance Test)

Resistances of a TaO film, a TaN film, and a MoSiON film to hot water and alkali (ammonia-hydrogen peroxide mixture) were examined.

The TaN film was formed on a substrate in the same manner as in Example 1. Specifically, using a Ta target, the TaN film having a thickness of 50 nm was formed on a synthetic quartz substrate by reactive sputtering under the conditions where the flow rate of Xe and the flow rate of $N_2$ were set to 12.7 sccm and 10 sccm, respectively, and the power of a DC power supply was set to 1.5 kW.

The TaO film was formed on a substrate in the same manner as in Example 1. Specifically, using a Ta target, the TaO film having a thickness of 50 nm was formed on a synthetic quartz substrate by reactive sputtering under the conditions where the flow rate of Ar and the flow rate of $O_2$ were set to 90 sccm and 34.7 sccm, respectively, and the power of a DC power supply was set to 0.7 kW.

The MoSiON film having a thickness of 50 nm was formed on a synthetic quartz substrate by reactive sputtering using a mixed target of molybdenum (Mo) and silicon (Si) (Mo:Si=1:9 [at %]) in a mixed gas atmosphere of argon (Ar), nitrogen ($N_2$), and oxygen ($O_2$) (Ar:$N_2$:$O_2$=10:80:10 [vol %]; pressure: 0.3 [Pa]).

The conditions of chemical resistance tests are shown below.
(1) Conditions of Alkali (Ammonia-Hydrogen Peroxide Mixture) Resistance Test
Used Chemical Solutions: aqueous ammonia ($NH_4OH$) 29% EL grade (manufactured by Kanto Chemical Co., Inc.)
aqueous hydrogen peroxide ($H_2O_2$) 30% EL grade (manufactured by Kanto Chemical Co., Inc.)
Chemical Solution Mixing Ratio:
$NH_4OH$:$H_2O_2$:$H_2O$=1:1:5 (volume ratio)
Treatment Time: immersion for 60 minutes in the above mixed chemical solution
(2) Conditions of Hot Water Resistance Test
Pure Water Temperature: 90° C.
Treatment Time: immersion for 60 minutes The results of the chemical resistance tests are shown in Table 1 below.

TABLE 1

| Film Material | Thickness Change by Alkali Immersion (nm) | Thickness Change by Hot Water Immersion (nm) |
|---|---|---|
| MoSiON | −1.4 | −7.6 |
| TaN | −0.6 | +0.8 |
| TaO | +0.3 | −0.5 |

(+ represents an increase in thickness)

For example, MoSiON being an antireflection layer in a MoSi-based light-shielding film (e.g. MoSi main light-shielding layer/MoSiON antireflection layer) described in Patent Document 1 or 2 is insufficient in resistance to hot water and alkali so that a level difference occurs in a pattern of the MoSi-based light-shielding film.

In each Example of this invention, Ta oxide is used as the antireflection layer and is excellent in resistance to hot water and alkali as compared with MoSiON.

Comparative Example 1

In the case of using a phase shift mask blank of light-transmitting substrate/MoSi-based halftone phase shift film/Cr-based light-shielding film/EB resist or in the case of using a photomask blank of light-transmitting substrate/Cr-based light-shielding film/EB resist for manufacturing a phase shift mask of the substrate dug-down type, the combination of Cr-based light-shielding film/EB resist is included and the EB resist is etched to some degree with a mixed gas of a chlorine gas and an oxygen gas being an etching gas for the Cr-based light-shielding film, and therefore, it is difficult to reduce the thickness of the EB resist to 200 nm or less.

On the other hand, in this invention, the combination of tantalum-based film/EB resist is employed and the EB resist has resistance to a fluorine-based gas being an etching gas for the tantalum-based film, and therefore, it is possible to reduce the thickness of the EB resist to 200 nm or less. Simultaneously, with the structure of Cr-based etching mask film/ tantalum-based film, it is possible to reduce the thickness of the EB resist while maintaining the optical density (OD) of the light-shielding portion (light-shielding film).

Comparative Example 2

In the case of using a phase shift mask blank of light-transmitting substrate/MoSi-based halftone phase shift film/Ta-based light-shielding film (e.g. TaN/TaO)/EB resist or in the case of using a photomask blank of light-transmitting substrate/Ta-based light-shielding film (e.g. TaN/TaO)/EB resist for manufacturing a phase shift mask of the substrate dug-down type, since the Ta-based light-shielding film (e.g. TaN/TaO) is etched with a fluorine-based gas, it cannot serve as an etching mask (hard mask) for the MoSi-based halftone phase shift film or the light-transmitting substrate that is also etched with a fluorine-based gas.

On the other hand, in this invention, the Cr-based film is inserted and functions as an etching mask (hard mask) for the MoSi-based halftone phase shift film or the light-transmitting substrate.

Comparative Example 3

In the case of using a phase shift mask blank of light-transmitting substrate/MoSi-based halftone phase shift film/Ta-based light-shielding film (e.g. TaHf or TaZr/TaO)/EB resist or in the case of using a photomask blank of light-transmitting substrate/Ta-based light-shielding film (e.g. TaHf or TaZr/TaO)/EB resist for manufacturing a phase shift mask of the substrate dug-down type, although a hard mask function against etching with a fluorine-based gas is provided by adding Hf or Zr to Ta, when removing TaHf, damage to the MoSi-based halftone phase shift film or the light-transmitting substrate cannot be avoided.

Specifically, when removing TaHf by dry etching, the TaHf metal can be etched with a $Cl_2$ gas, but is easily oxidized in the air, and therefore, it cannot be removed unless the physical etching effect is intensified.

On the other hand, when removing TaHf by wet etching, it is necessary to use hydrofluoric acid or hot caustic soda and thus damage to the light-transmitting substrate or the MoSiON halftone film cannot be avoided.

In this invention, the Ta-based thin film is removed during etching with a fluorine-based gas for forming a phase shift pattern from the MoSi-based halftone phase shift film or the light-transmitting substrate and the remaining Cr-based film can be dry-etched with $Cl_2$+$O_2$ or wet-etched with ceric ammonium nitrate or the like, and therefore, damage to the phase shift pattern can be avoided.

Example 5

Example 5 relates to a method of manufacturing a photomask blank for use in manufacturing a phase shift mask of the type in which a high-transmittance phase shift portion is formed by providing a halftone phase shift film and further by digging down a substrate, and further relates to a method of manufacturing the photomask.

[Manufacture of Photomask Blank]

Referring to FIGS. 8A to 8J, description will be given of photomask blank and photomask manufacturing methods according to Example 5 of this invention.

First, a substrate made of quartz was mirror-polished and then cleaned, thereby obtaining a light-transmitting substrate 1 of 6 inches×6 inches×0.25 inches (FIG. 8A).

Then, using a mixed target of molybdenum (Mo) and silicon (Si) (Mo:Si=1:9 [at %]), reactive sputtering was carried out in a mixed gas atmosphere of argon (Ar) and nitrogen ($N_2$) (Ar:$N_2$=10:90 [vol %]; pressure: 0.3 [Pa]), thereby forming a MoSiN-based light-semitransmitting phase shift film 30 having a thickness of 30 nm on the light-transmitting substrate 1 (FIG. 8A). In this event, the transmittance of the phase shift film 30 for ArF exposure light (wavelength: 193 nm) was 20%, i.e. a high transmittance.

Then, using a DC magnetron sputtering apparatus, an etching mask film 10 was formed on the phase shift film 30 (FIG. 8A). Specifically, using a chromium target, CrOCN was formed to a thickness of 20 nm under the conditions of introducing gases and flow rates of Ar=18 sccm, $CO_2$=18 sccm, $N_2$=10 sccm and a sputtering power of 1.7 kW. In this event, the film stress of the CrOCN film was adjusted to be as small as possible (preferably, substantially zero).

Then, the substrate 1 formed with the etching mask film 10 was introduced into a DC magnetron sputtering apparatus. After the inside of the sputtering apparatus was evacuated to $2 \times 10^{-5}$ (Pa) or less, a mixed gas of Xe and $N_2$ was introduced into the sputtering apparatus. In this event, the flow rate of Xe and the flow rate of $N_2$ were adjusted to 12.9 sccm and 5 sccm, respectively. Ta was used as a sputtering target. After the gas flow rates were stabilized, the power of a DC power supply was set to 1.5 kW, thereby forming a tantalum nitride (TaN) layer 21 having a thickness of 23 nm on the etching mask film 10 (FIG. 8A).

Then, while the substrate 1 formed with the tantalum nitride (TaN) layer 21 was maintained in the sputtering apparatus, a mixed gas containing an Ar gas at a flow rate of 90 sccm and an $O_2$ gas at a flow rate of 34.7 sccm was introduced into the sputtering apparatus and then the power of the DC power supply was set to 0.7 kW, thereby stacking a tantalum oxide (TaO) layer 22 having a thickness of 10 nm on the tantalum nitride (TaN) layer 21 (FIG. 8A).

In the manner described above, there was formed a tantalum-based light-shielding film 20 comprising the tantalum nitride (TaN) layer 21 and the tantalum oxide (TaO) layer 22 stacked together.

The reflectance (front-surface reflectance) of a surface, remote from the substrate 1, of the light-shielding film 20 thus formed was 25.3% for ArF exposure light (wavelength: 193 nm). Further, the transmittance for ArF exposure light was 0.1%. AES (Auger electron spectroscopy) analysis was performed, wherein the N content of the tantalum nitride (TaN) layer 21 was 15 at % and the O content of the tantalum oxide (TaO) layer 22 was 65 at %.

The sheet resistance was measured for the sample at the stage where the tantalum oxide (TaO) layer 22 was formed, and it was 85 Ω/square.

[Manufacture of Photomask]

As shown in FIG. 8A, using a photomask blank thus manufactured, a chemically amplified positive resist 50 for electron beam lithography (exposure) (FEP171: manufactured by FUJIFILM Electronic Materials Co., Ltd.) was applied to a thickness of 150 nm on the tantalum oxide (TaO) layer 22 by a spin-coating method.

Then, using an electron beam lithography apparatus, pattern writing was performed on the resist film 50 and, thereafter, development was carried out using a predetermined developer, thereby forming a resist pattern 50*a* (FIG. 8B).

Then, using the resist pattern 50*a* as a mask, the tantalum oxide (TaO) layer 22 was dry-etched with $CHF_3$ used as an etching gas, thereby forming a tantalum oxide (TaO) layer pattern 22*a* (FIG. 8C).

Subsequently, using the resist pattern 50*a* and the tantalum oxide (TaO) layer pattern 22*a* as a mask, the tantalum nitride (TaN) layer 21 was dry-etched with $Cl_2$ used as an etching gas, thereby forming a tantalum nitride (TaN) layer pattern 21*a* (FIG. 8D).

Then, using the resist pattern 50*a* and a tantalum-based film pattern 20*a* (tantalum nitride (TaN) layer pattern 21*a*/tantalum oxide (TaO) layer pattern 22*a*) as a mask, the chromium-based etching mask film 10 was dry-etched, thereby forming a chromium-based etching mask film pattern 10*a* (FIG. 8E). In this event, a mixed gas of $Cl_2$ and $O_2$ ($Cl_2$:$O_2$=4:1) was used as a dry etching gas.

Then, as shown in FIG. 8F, the resist pattern 50*a* that became unnecessary was stripped and then a chemically amplified positive resist 51 for electron beam lithography (exposure) (FEP171: manufactured by FUJIFILM Electronic Materials Co., Ltd.) was applied again to a thickness of 150 nm by the spin-coating method.

Then, using the electron beam lithography apparatus, pattern writing was performed on the resist film 51 and, thereafter, development was carried out using the predetermined developer, thereby forming a resist pattern 51*a* (FIG. 8G). Herein, the resist pattern 51*a* was formed at a portion where the light-shielding film pattern was to remain.

Then, using the chromium-based etching mask film pattern 10*a* as a mask, the halftone phase shift film 30 and the light-transmitting substrate 1 were dry-etched in order using a $CHF_3$ gas, thereby forming a halftone phase shift film pattern 30*a* and a dug-down part 1*a* on the light-transmitting substrate 1 to obtain a phase shift pattern (phase shift portion) (FIG. 8H). In this event, the light-transmitting substrate 1 was etched to a depth adapted to obtain a phase difference of 180° as the sum of phase differences produced by the halftone phase shift film pattern 30*a* and the substrate dug-down part 1*a* (specifically, a depth of 96 nm).

During this dry etching, the tantalum-based film pattern 20*a* (tantalum nitride (TaN) layer pattern 21*a*/tantalum oxide (TaO) layer pattern 22*a*) gradually disappeared by the dry etching and, at the completion of the etching of the light-transmitting substrate 1, the TaO/TaN film at a portion with no resist pattern 51*a* fully disappeared (FIG. 8H). This is because the sum of the thickness 30 nm of the halftone phase shift film 30 and the etching depth 96 nm of the light-transmitting substrate 1, being 126 nm, is sufficiently large with respect to the total thickness 33 nm of the TaO/TaN film and thus the etching time is sufficiently long.

Then, the etching mask film pattern 10*a* at a portion with no resist pattern 51*a* was stripped by dry etching with a mixed gas of $Cl_2$ and $O_2$ ($Cl_2$:$O_2$=4:1) (FIG. 8I).

Then, the resist pattern 51*a* was stripped (FIG. 8J) and then cleaning was carried out, thereby obtaining a photomask 100.

[Evaluation]

The photomask obtained in Example 5 was evaluated.

As a result, with respect to the resolution of the high-transmittance phase shift portion formed on the photomask by providing the halftone phase shift film and further by digging down the substrate, it was possible to resolve a phase shift portion of 50 nm.

Simultaneously, the transmittance for ArF exposure light was 0.1% at the light-shielding portion formed by the halftone phase shift film 30, the chromium-based etching mask film 10, and the tantalum-based film 20 stacked together and it was possible to achieve an optical density OD=3.0.

In the manufacturing processes of the photomask of Example 5, the resist pattern 50*a* was stripped after forming the etching mask film pattern 10*a* (between the processes of FIGS. 8E and 8F). However, the resist pattern 50*a* may be stripped after forming the tantalum oxide (TaO) layer pattern 22a (between the processes of FIGS. 8C and 8D). The processing accuracy is further improved.

Further, in the manufacturing processes of the photomask of Example 5, the tantalum oxide (TaO) layer pattern 22a was formed using CHF$_3$ as an etching gas and then the tantalum nitride (TaN) layer pattern 21a was formed using Cl$_2$ as an etching gas, but instead, the tantalum oxide (TaO) layer pattern 22a and the tantalum nitride (TaN) layer pattern 21a may be continuously formed using CHF$_3$ as an etching gas.

Example 6

Example 6 relates to a method of manufacturing a photomask blank for use in manufacturing a phase shift mask of the type in which a substrate is not dug down and a high-transmittance phase shift portion film pattern is formed by providing a high-transmittance halftone phase shift film, and further relates to a method of manufacturing the photomask.

[Manufacture of Photomask Blank]

As shown in FIG. 9A, using a synthetic quartz substrate of 6 inches×6 inches×0.25 inches as a light-transmitting substrate 1, there was formed, on the light-transmitting substrate 1, a high-transmittance halftone phase shift film 30 in the form of a laminated film comprising a transmittance adjusting layer 31 made of TaHf and a phase adjusting layer 32 made of SiON. Specifically, using a target of Ta:Hf=80:20 (at % ratio) and using Ar as a sputtering gas, the layer 31 made of tantalum and hafnium (TaHf layer: at % ratio of Ta and Hf in the layer was about 80:20) was formed to a thickness of 8 nm and, then, using a Si target, reactive sputtering was carried out in a mixed gas atmosphere of argon (Ar), nitrogen (N$_2$), and oxygen (O$_2$) (Ar:N$_2$:O$_2$=20:57:23 [vol %]), thereby forming the SiON layer 32 having a thickness of 83 nm. In this event, the thicknesses of the respective layers were adjusted to cause the halftone phase shift film 30 to produce a phase difference of 180° for ArF exposure light (wavelength: 193 nm). The transmittance of the halftone phase shift film 30 for ArF exposure light (wavelength: 193 nm) was 20%, i.e. a high transmittance.

Then, using a DC magnetron sputtering apparatus, an etching mask film 10 was formed on the phase shift film 30 (FIG. 9A). Specifically, using a chromium target, CrOCN was formed to a thickness of 15 nm under the conditions of introducing gases and flow rates of Ar=18 sccm, CO$_2$=18 sccm, N$_2$=10 sccm and a sputtering power of 1.7 kW. In this event, the film stress of the CrOCN film was adjusted to be as small as possible (preferably, substantially zero).

Then, the substrate 1 formed with the etching mask film 10 was introduced into a DC magnetron sputtering apparatus. After the inside of the sputtering apparatus was evacuated to 2×10$^{-5}$ (Pa) or less, a mixed gas of Xe and N$_2$ was introduced into the sputtering apparatus. In this event, the flow rate of Xe and the flow rate of N$_2$ were adjusted to 12.7 sccm and 10 sccm, respectively. Ta was used as a sputtering target. After the gas flow rates were stabilized, the power of a DC power supply was set to 1.5 kW, thereby forming a tantalum nitride (TaN) layer 21 having a thickness of 14 nm on the etching mask film 10 (FIG. 9A).

Then, while the substrate 1 formed with the tantalum nitride (TaN) layer 21 was maintained in the sputtering apparatus, a mixed gas containing an Ar gas at a flow rate of 90 sccm and an O$_2$ gas at a flow rate of 34.7 sccm was introduced into the sputtering apparatus and then the power of the DC power supply was set to 0.7 kW, thereby stacking a tantalum oxide (TaO) layer 22 having a thickness of 10 nm on the tantalum nitride (TaN) layer 21 (FIG. 9A).

In the manner described above, there was formed a tantalum-based light-shielding film 20 comprising the tantalum nitride (TaN) layer 21 and the tantalum oxide (TaO) layer 22 stacked together The reflectance (front-surface reflectance) of a surface, remote from the substrate 1, of the light-shielding film 20 thus formed was 25.9% for ArF exposure light (wavelength: 193 nm). Further, the transmittance for ArF exposure light was 0.1%. AES (Auger electron spectroscopy) analysis was performed, wherein the N content of the tantalum nitride (TaN) layer 21 was 23 at % and the O content of the tantalum oxide (TaO) layer 22 was 65 at %.

The sheet resistance was measured for the sample at the stage where the tantalum oxide (TaO) layer 22 was formed, and it was 185 Ω/square.

[Manufacture of Photomask]

As shown in FIG. 9A, using a photomask blank thus manufactured, a chemically amplified positive resist 50 for electron beam lithography (exposure) (FEP171: manufactured by FUJIFILM Electronic Materials Co., Ltd.) was applied to a thickness of 150 nm on the tantalum oxide (TaO) layer 22 by a spin-coating method.

Then, using an electron beam lithography apparatus, pattern writing was performed on the resist film 50 and, thereafter, development was carried out using a predetermined developer, thereby forming a resist pattern 50a (FIG. 9B).

Then, using the resist pattern 50a as a mask, the tantalum oxide (TaO) layer 22 was dry-etched with CHF$_3$ used as an etching gas, thereby forming a tantalum oxide (TaO) layer pattern 22a (FIG. 9C).

Subsequently, using the resist pattern 50a and the tantalum oxide (TaO) layer pattern 22a as a mask, the tantalum nitride (TaN) layer 21 was dry-etched with Cl$_2$ used as an etching gas, thereby forming a tantalum nitride (TaN) layer pattern 21a (FIG. 9D).

Then, using the resist pattern 50a and a tantalum-based film pattern 20a (tantalum nitride (TaN) layer pattern 21a/tantalum oxide (TaO) layer pattern 22a) as a mask, the chromium-based etching mask film 10 was dry-etched, thereby forming a chromium-based etching mask film pattern 10a (FIG. 9E). In this event, a mixed gas of Cl$_2$ and O$_2$(Cl$_2$:O$_2$=4:1) was used as a dry etching gas.

Then, as shown in FIG. 9F, the resist pattern 50a that became unnecessary was stripped and then a chemically amplified positive resist 51 for electron beam lithography (exposure) (FEP171: manufactured by FUJIFILM Electronic Materials Co., Ltd.) was applied again to a thickness of 150 nm by the spin-coating method.

Then, using the electron beam lithography apparatus, pattern writing was performed on the resist film 51 and, thereafter, development was carried out using the predetermined developer, thereby forming a resist pattern 51a (FIG. 9G). Herein, the resist pattern 51a was formed at a portion where the light-shielding film pattern was to remain.

Then, using the chromium-based etching mask film pattern 10a as a mask, the SiON phase adjusting layer 32 was dry-etched with a fluorine-based gas (mixed gas of SF$_6$ and He) as an etching gas, thereby forming a SiON phase adjusting layer pattern 32a (FIG. 9H). During this dry etching, the tantalum-based film pattern 20a (tantalum nitride (TaN) layer pattern 21a/tantalum oxide (TaO) layer pattern 22a) gradually disappeared by the dry etching with the fluorine-based gas and, at the completion of the etching of the SiON phase adjusting layer 32, the TaO/TaN film at a portion with no resist pattern 51a fully disappeared (FIG. 9H). This is because the thickness 83 nm of the SiON phase adjusting layer 32 is sufficiently large with respect to the total thickness 24 nm of the TaO/TaN film and thus the etching time is sufficiently long.

Then, using the chromium-based etching mask film pattern 10a and so on as a mask, the TaHf transmittance adjusting layer 31 was dry-etched with a $Cl_2$ gas as an etching gas, thereby forming a TaHf transmittance adjusting layer pattern 31a (FIG. 9I).

Then, the chromium-based etching mask film pattern 10a was removed using a mixed gas of $Cl_2$ and $O_2$ ($Cl_2$:$O_2$=4:1) as an etching gas (FIG. 9J).

Then, the resist pattern 51a was stripped (FIG. 9K) and then cleaning was carried out, thereby obtaining a photomask 100 having a phase shift film pattern (phase shift portion) 30a with the structure in which the TaHf transmittance adjusting layer pattern 31a and the SiON phase adjusting layer pattern 32a were stacked together.

[Evaluation]

The photomask obtained in Example 6 was evaluated.

As a result, with respect to the resolution of the phase shift film pattern (phase shift portion) 30a formed on the photomask, it was possible to resolve a phase shift film pattern of 50 nm.

Simultaneously, the transmittance for ArF exposure light was 0.1% at the light-shielding portion formed by the halftone phase shift film 30, the chromium-based etching mask film 10, and the tantalum-based film 20 stacked together and it was possible to achieve an optical density OD=3.0.

In the manufacturing processes of the photomask of Example 6, the resist pattern 50a was stripped after forming the etching mask film pattern 10a (between the processes of FIGS. 9E and 9F). However, the resist pattern 50a may be stripped after forming the tantalum oxide (TaO) layer pattern 22a (between the processes of FIGS. 9C and 9D). The processing accuracy is further improved.

Further, in the manufacturing processes of the photomask of Example 6, the tantalum oxide (TaO) layer pattern 22a was formed using $CHF_3$ as an etching gas and then the tantalum nitride (TaN) layer pattern 21a was formed using $Cl_2$ as an etching gas, but instead, the tantalum oxide (TaO) layer pattern 22a and the tantalum nitride (TaN) layer pattern 21a may be continuously formed using $CHF_3$ as an etching gas.

While this invention has been described with reference to the embodiments and Examples, the technical scope of the invention is not limited to the scope of the description of the above embodiments and Examples. It is obvious to a person skilled in the art that various changes or improvements can be added to the above embodiments and Examples. It is clear from the description in the scope of claims that the modes added with such changes or improvements can also be included in the technical scope of this invention.

What is claimed is:

1. A photomask blank for manufacturing a phase shift mask having a light-transmitting substrate provided with a phase shift portion adapted to give a predetermined phase difference to transmitted exposure light, wherein the phase shift portion is a dug-down part that is dug down from a surface of the light-transmitting substrate to a digging depth adapted to produce the predetermined phase difference with respect to exposure light transmitted through the light-transmitting substrate at a portion where the phase shift portion is not provided, and the photomask blank comprises:

an etching mask film, on a digging-side surface of the light-transmitting substrate, that is made of a material being dry-etchable with a chlorine-based gas, but not dry-etchable with a fluorine-based gas, and serves as an etching mask at least until, when forming the dug-down part by dry etching, the dry etching reaches the digging depth; and a light-shielding film, on a surface of the etching mask film, that is made of a material mainly containing tantalum and has a thickness so as to be removable during the dry etching for forming the dug-down part of the light-transmitting substrate.

2. A photomask blank according to claim 1, wherein the light-shielding film comprises:

a light-shielding layer mainly containing tantalum nitride; and an antireflection layer stacked on an upper surface of the light-shielding layer and mainly containing tantalum oxide.

3. A photomask blank according to claim 2, wherein the thickness of the light-shielding film is 15 nm to 50 nm.

4. A photomask blank according to claim 3, wherein the etching mask film is made of a material mainly containing one of chromium, chromium nitride, chromium oxide, chromium oxynitride, and chromium oxycarbonitride.

5. A photomask blank according to claim 4, wherein the etching mask film has a thickness of 5 nm to 40 nm.

6. A photomask blank according to claim 2, wherein the etching mask film is made of a material mainly containing one of chromium, chromium nitride, chromium oxide, chromium oxynitride, and chromium oxycarbonitride.

7. A photomask blank according to claim 6, wherein the etching mask film has a thickness of 5 nm to 40 nm.

8. A photomask blank according to claim 1, wherein the thickness of the light-shielding film is 15 nm to 50 nm.

9. A photomask blank according to claim 8, wherein the etching mask film is made of a material mainly containing one of chromium, chromium nitride, chromium oxide, chromium oxynitride, and chromium oxycarbonitride.

10. A photomask blank according to claim 9, wherein the etching mask film has a thickness of 5 nm to 40 nm.

11. A photomask blank according to claim 1, wherein the etching mask film is made of a material mainly containing one of chromium, chromium nitride, chromium oxide, chromium oxynitride, and chromium oxycarbonitride.

12. A photomask blank according to claim 11, wherein the etching mask film has a thickness of 5 nm to 40 nm.

13. A photomask blank according to claim 1, wherein the etching mask film has a thickness of 5 nm to 40 nm.

14. A photomask manufactured using the photomask blank according to claim 1.

* * * * *